US011367722B2

(12) United States Patent
Lilak et al.

(10) Patent No.: US 11,367,722 B2
(45) Date of Patent: Jun. 21, 2022

(54) STACKED NANOWIRE TRANSISTOR STRUCTURE WITH DIFFERENT CHANNEL GEOMETRIES FOR STRESS

(71) Applicant: INTEL CORPORATION, Santa Clara, CA (US)

(72) Inventors: Aaron Lilak, Beaverton, OR (US); Stephen Cea, Hillsboro, OR (US); Gilbert Dewey, Beaverton, OR (US); Willy Rachmady, Beaverton, OR (US); Roza Kotlyar, Portland, OR (US); Rishabh Mehandru, Portland, OR (US); Sean Ma, Portland, OR (US); Ehren Mannebach, Beaverton, OR (US); Anh Phan, Beaverton, OR (US); Cheng-Ying Huang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 762 days.

(21) Appl. No.: 16/138,356

(22) Filed: Sep. 21, 2018

(65) Prior Publication Data
US 2020/0098756 A1 Mar. 26, 2020

(51) Int. Cl.
| H01L 27/092 | (2006.01) |
| H01L 29/06 | (2006.01) |
| H01L 29/78 | (2006.01) |
| H01L 29/66 | (2006.01) |
| H01L 29/423 | (2006.01) |
| H01L 29/10 | (2006.01) |
| H01L 29/08 | (2006.01) |
(Continued)

(52) U.S. Cl.
CPC .. *H01L 27/0924* (2013.01); *H01L 21/823821* (2013.01); *H01L 21/823842* (2013.01); *H01L 29/0673* (2013.01); *H01L 29/0847* (2013.01); *H01L 29/1054* (2013.01); *H01L 29/16* (2013.01); *H01L 29/42372* (2013.01); *H01L 29/66545* (2013.01); *H01L 29/66553* (2013.01); *H01L 29/7851* (2013.01); *H01L 2029/7858* (2013.01)

(58) Field of Classification Search
CPC ............... H01L 27/092; H01L 27/0924; H01L 29/78696; H01L 21/823821; H01L 29/42392; H01L 29/0673; H01L 2029/7858
See application file for complete search history.

(56) References Cited

U.S. PATENT DOCUMENTS

2015/0228652 A1* 8/2015 Cheng ................... B82Y 10/00
257/369
2018/0156749 A1* 6/2018 Rozeau ............... G01N 27/228

* cited by examiner

*Primary Examiner* — Changhyun Yi
(74) *Attorney, Agent, or Firm* — Schwabe, Williamson & Wyatt, P.C.

(57) ABSTRACT

A nanowire transistor structure has a first device region with a first body of semiconductor material having a first cross-sectional shape. A second device region has a second body with a second cross-sectional shape different from the first cross-sectional shape. The first device section is vertically above or below the second device section with the bodies extending horizontally between a source and drain. A first gate structure is wrapped around the first body and a second gate structure is wrapped around the second body. Differences in the geometries of the nanowires can be used to optimize performance in the first device section independently of the second device section.

22 Claims, 10 Drawing Sheets

(51) Int. Cl.
*H01L 21/8238* (2006.01)
*H01L 29/16* (2006.01)

STACKED NANOWIRE TRANSISTOR STRUCTURE WITH DIFFERENT CHANNEL GEOMETRIES FOR STRESS

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device largely resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. A nanowire transistor (sometimes referred to as a gate-all-around (GAA) or nanoribbon transistor) is configured similarly to a fin-based transistor, but instead of a finned channel region with the gate is contact with three sides of the fin, the gate material generally surrounds or encircles each nanowire (hence, gate-all-around). A nanowire FET can have one or more nanowires that extend between the source and the drain.

Figure 1A:
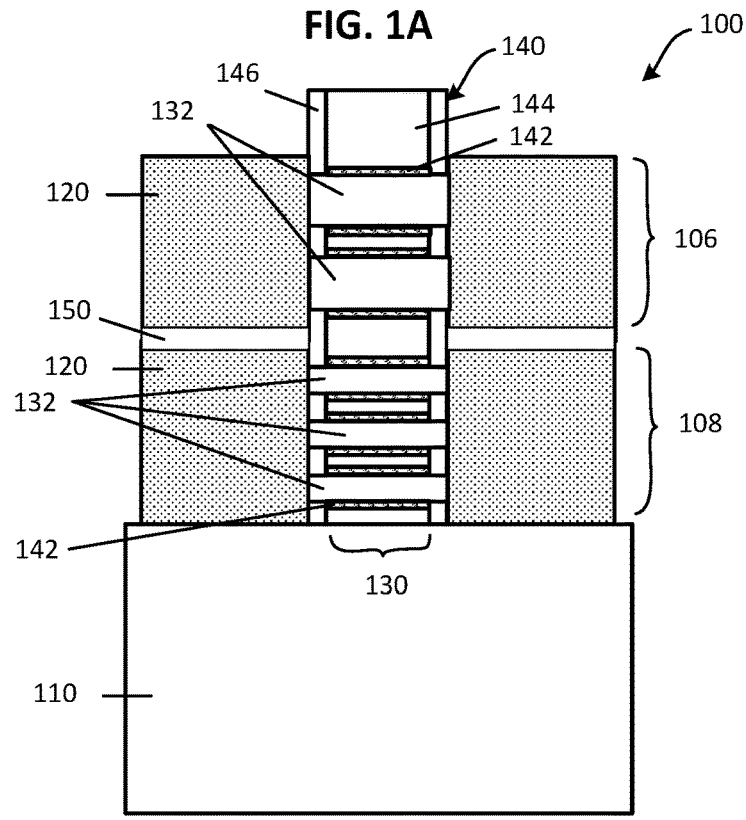
FIG. 1A illustrates a cross-sectional view taken through the gate structure of a transistor structure with an upper device section having nanowires of a first cross-sectional shape and a lower device section having nanowires of a different second cross-sectional shape, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed for fabricating a self-aligned, stacked nanowire transistor structures with differences in geometry between a lower device portion and an upper device portion, in accordance with one embodiment. For a device including both NMOS and PMOS channel regions, for example, differences in the geometry of the nanowires can be used to optimize strain independently for the NMOS and PMOS sections, therefore providing improved performance over embodiments in which the NMOS and PMOS nanowires have the same geometry. For example, a stacked nanowire transistor is configured for NMOS operation in the upper device section and configured for PMOS operation in the lower device section. In one such embodiment fabricated upon silicon with a substrate (100) orientation with fins fabricated with (110) sidewall orientation, the cross-sectional shape of the NMOS silicon wires is elongated vertically to enhance vertical lattice strain and reduce horizontal lattice strain, which has shown to benefit performance in NMOS devices. In contrast, the PMOS wires in the lower device portion may have a greater horizontal width than vertical height to favor horizontal lattice strain as favorable in PMOS devices. Reduced vertical spacing between adjacent nanowires of one device section can similarly be employed to reduce the horizontal component of lattice strain. In another embodiment, the work function metal surrounding the nanowire in the NMOS channel is reduced on the top and bottom portions of the wires compared to the side portions of the wires to reduce the horizontal strain component. In yet another embodiment, an airgap can be positioned between wires of the NMOS portion of the device to reduce the horizontal strain associated with the interface of the gate structure and the nanowire. In yet another embodiment, additional work function material is deposited along the sides of NMOS wires, forming continuous metal structure around and between the nanowires of the device section. The added thickness of the work function material along sides of the nanowires enhances vertical lattice strain in the wires. Using one or more of the aforementioned techniques enables the performance in NMOS and PMOS sections of a stacked transistor to be optimized independently for overall improved performance, such as for CMOS applications. Numerous configurations will be apparent in light of the present disclosure.

General Overview

Field effect transistors (FETs) have been scaled to smaller and smaller sizes to achieve faster circuit operation. Such scaling has resulted in the development of the nanowire and nanoribbon transistors or gate-all-around (GAA) transistors. For example, the GAA channel region can have one or more nanowires extending between the source and drain regions, such as a vertical stack of nanowires that extend horizontally between the source and drain regions. In one example methodology, alternating layers of silicon (Si) and silicon germanium (SiGe) are formed on a bulk silicon substrate with a (100) orientation. The resulting structure is then etched to define a fin that includes a silicon subfin and alternating layers of SiGe and Si. The SiGe is then removed, such as by a gas-phase chlorine trifluoride ($ClF_3$) etch, to release silicon nanowires extending between and connecting the source and drain regions of the fin. A similar process can be used to remove the silicon to release SiGe nanowires, and for other material combinations, such as gallium (Ga) and gallium arsenide (GaAs). The semiconductor material of the nanowire/nanoribbon channel can include any suitable semiconductor material, including group IV semiconductor materials (e.g., silicon, germanium, and silicon germanium) and group III-V semiconductor materials (e.g., gallium nitride, indium gallium arsenide, gallium arsenide).

Nanowire transistors can be fabricated in a stacked configuration, such as when an NMOS transistor is positioned vertically above a PMOS transistor or vice versa. Such stacked nanowire transistor device configurations are useful for CMOS applications. The nanowires/nanoribbons can have the same cross-sectional geometry, which may be round, oval, or flattened oval shape that has a greater horizontal size than vertical size. Although such geometry is acceptable for PMOS devices, when the wire is surrounded by the gate structure, biaxial strain results and degrades the mobility in NMOS wires compared to that in fins.

To address this and other challenges, variations in the shape of the wire and/or the work function metal surrounding the wire can induce strain that is favorable to enhancing the vertical component of lattice strain, such as in silicon NMOS devices. At the same time, geometries favorable to lattice strain for PMOS devices can be used in another section of the stacked device. In accordance with some embodiments, a stacked nanowire device configuration includes a lower device section and an upper device section. Performance of the NMOS portion of the device can be improved by increasing vertical strain over horizontal strain, such as in silicon-based channel materials. In one such embodiment, enhanced vertical strain is achieved by forming nanowires with an elongated vertical shape that approximates the vertical compression observed in the channel of a FinFET. For example, the cross-sectional shape of silicon nanowires have a vertical dimension that is at least 1.5 times the horizontal dimension, resulting in increased vertical compressive strain that is favorable to NMOS performance.

In another embodiment, the geometry of the work function metal surrounding silicon wires of the NMOS channel can be configured to enhance vertical compressive strain favorable to NMOS performance. For example, the vertical spacing can be reduced between adjacent wires in an NMOS device. Doing so also reduces the amount of metal between the wires, therefore reducing the horizontal strain and emphasizing the vertical strain. In another example, an air gap or void between vertically adjacent wires of an NMOS device reduces the contact between the work function metal and the horizontal component of the wire, and therefore reduces the contribution of horizontal strain. In yet another example, additional work function material can be deposited along the sides of the nanowire channel to form continuous work function layer that wraps around and connects a plurality of NMOS wires. In one such embodiment, additional work function metal is added along the side of a group of NMOS wires to define a metal structure that contacts two or more wires at the same time in a merged configuration, rather than encircling each wire individually. The added metal along the side of the channel (e.g., three nanowires) of the NMOS device induces more vertical strain that is favorable to NMOS performance.

Methodologies and structures of the present disclosure can provide an improved nanowire performance, such as used in CMOS structures. For various materials in a nanowire device, such methodologies can be used to enhance or reduce strain in a certain plane as desirable for improved drive current, speed, voltage, and/or other device performance. Numerous variations, embodiments, and applications will be apparent in light of the present disclosure.

As used herein, the term "nanowire" is not limited to structures of a particular cross-sectional shape, but includes structures of a rectangular, square, trapezoidal, "racetrack" (e.g., parallel sides connected by rounded ends), circular, oval, elongated, and other cross-sectional shapes, some of which may be referred to as nanoribbons or nanosheets. Specifically, in accordance with some embodiments, a nanowire is a structure that has a thickness or diameter on the order of tens of nanometers or less, and an unconstrained length. Further note that the term "end" as used herein with respect to nanowires or nanoribbons need not be the absolute or terminal end of a given length. Rather, the end may simply refer to a portion of that nanowire/nanoribbon that includes a source or drain region. For instance, in cases where the source/drain region is continuous with the channel region, such as the case where the source/drain regions are doped portions of the multilayer structure from which the nanowires are formed, the "end" may refer to the portion of the nanowire/nanoribbon that includes the source/drain region as well as the region under the gate spacer (if a gate spacer if present). In such cases, the channel region has a first cross-sectional shape (rounded corners) and the remainder of the nanowire/nanoribbon, including the source/drain regions and any portion of the nanowire/nanoribbon within a gate spacer (if present), has a second shape (e.g., sharp corners). In other cases, such as in cases where the source/drain regions are replacement or epitaxial source/drain regions, the end may be the portion of the nanowire/nanoribbon within the gate spacer and/or between the source/drain region and the channel region.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

In some embodiments, a plurality of channel layers of compositionally different channel materials or geometries may be formed on different areas of the substrate, such as for CMOS applications, for example. For instance, a first channel material layer may be formed on a first area of a substrate to be used for one or more p-channel transistor devices (e.g., one or more PMOS devices) and a second channel material layer may be formed on a second area of the substrate to be used for one or more n-channel transistor devices (e.g., one or more NMOS devices). Silicon or other semiconductor materials may be selected for the substrate, as will be appreciated. By selecting the substrate to have the desired material characteristics (e.g., the desired semiconductor material, the desired dopant concentration, and desired dopant type) the substrate can be used to grow multiple different channel layers.

Note that the use of "source/drain" or "S/D" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

In some embodiments, the techniques described herein can be used to benefit n-channel devices (e.g., NMOS) and/or p-channel devices (e.g., PMOS). Further, in some embodiments, the techniques described herein can be used to benefit MOSFET devices, FinFET devices, and/or any other suitable devices as will be apparent in light of this disclosure. Further still, in some embodiments, the techniques described herein can be used to form complementary transistor circuits (such as CMOS circuits), where the techniques can be used to benefit one or more of the included n-channel and p-channel transistors making up the CMOS circuit. Further yet, in some embodiments, the techniques described herein can be used to benefit a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., beaded-fin configurations), to provide a few examples. In addition, in some embodiments, the techniques can be used for a variety of source/drain (S/D) configurations, such as replacement material S/D, cladded S/D, and/or any other suitable S/D configuration as will be apparent in light of this disclosure. The techniques described herein may be used to benefit logic transistor devices or transistor-based devices used for other suitable applications (e.g., amplification, switching, etc.). Therefore, the techniques described herein can be used to benefit a multitude of transistor devices.

In general, the techniques allow transistors to be further scaled with diverse channel materials, while ensuring higher operating voltage, higher drive currents, and thereby improved performance. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate a transistor with a nanowire channel region, where the gate or body portion has a different cross-sectional geometry compared to the end portions in contact with the gate spacer. For example, TEM can be useful to show a cross-sectional shape of the device structure. In another example, x-ray crystallography can be useful to illustrate the crystal quality of the active channel material, including relaxation and strain in a crystal lattice. In some embodiments, the techniques described herein may be detected based on the benefits derived from their use, which includes channel materials with improved carrier mobility, relatively higher operating voltage, relatively higher drive currents, and/or other improved device performance. Numerous configurations and variations will be apparent in light of this disclosure.

Architecture and Methodology

Figure 1B:
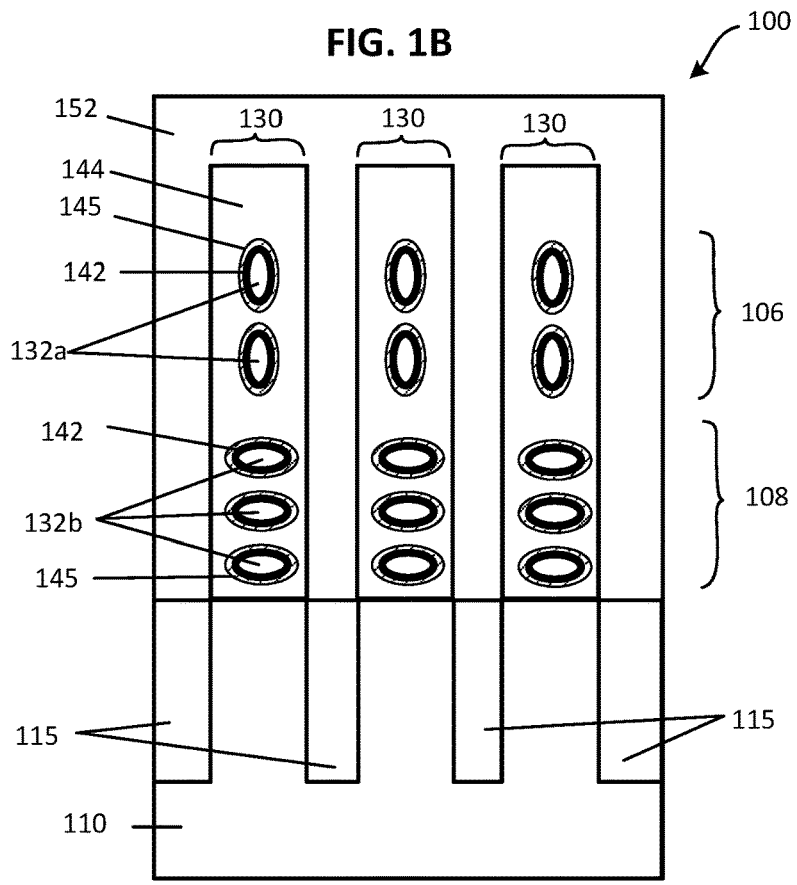
FIG. 1B illustrates a cross-sectional view of the transistor structure of FIG. 1A taken across the channel of three devices and showing the different cross-sectional shapes of the nanowires, in accordance with an embodiment of the present disclosure.

FIGS. 1A and 1B illustrate cross-sectional views of a CMOS transistor structure 100 fabricated on a silicon substrate 110, in accordance with an embodiment of the present disclosure. FIG. 1A shows a sectional view taken through the gate structure 140 and along the channel 130 and S/D 120, such as shown by line A-A of FIG. 9. FIG. 1A shows nanowires 132 in upper and lower device sections 106, 108 extending between source and drain regions 120. FIG. 1B is a cross-sectional view taken through the channel 130 and along the gate structure 140 of three devices, such as along line B-B of FIG. 9. FIG. 1B shows example cross-sections of nanowires 132 in the channel 130 upper and lower device sections 106, 108 in a stacked nanowire transistor structure 100.

In the example embodiment of FIGS. 1A-1B, the transistor structure 100 has a nanoribbon or nanowire 132 configuration. The transistor structure 100 is formed on a substrate 110, such as single-crystal silicon or other suitable semiconductor material. For example, the silicon has a (100) crystal lattice structure in a horizontal plane of the substrate and a (110) lattice structure along the sidewall of the nanowires 132 (e.g., in a vertical plane). The gate structure 140 in each of the upper and lower device sections 106, 108 is wrapped around nanowires 132 extending between and connecting a source and a drain (S/D) 120. The gate structure 140 includes a gate dielectric 142, a work function layer 145, a gate electrode 144, and gate spacers 146, for example. The gate dielectric 142, work function layer 145, and gate electrode 144 wrap around the body of each nanowire 132 between the gate spacers 146 with the gate dielectric between the body of the nanowire 132 and the gate electrode 144. Shown in FIG. 1B, the work function layer 145 is between the gate dielectric 142 and the gate electrode 144. The gate spacers 146 contact opposite faces of the gate electrode 144 and electrically isolate the S/D 120 from the gate electrode 144. The gate spacers 146 contact and wrap around ends of each nanowire 132. In this example, the channel region 130 is illustrated as having three nanowires 132 in the lower device section 108 and two nanowires 132 in the upper device section 106. In other embodiments, the channel region 130 of one or both device sections 106, 108 can be a fin, one or more nanoribbons, or one or more nanosheets, for example. Also, one or more nanowires/nanoribbons/nanosheets 132 can be used, as will be appreciated. An isolation layer 150 is between the S/D 120 of the upper and lower device sections 106, 108. In this example embodiment, the channel region 130 is described as having a nanowire configuration, but the illustrated geometries are merely examples and may not represent the actual geometry of such structures. In some embodiments, the channel 130 in the upper or lower device portion 106, 108 may be referred to as a nanoribbon or nanosheet.

The gate structure 140 is shown as being common to both the upper and lower device sections 106, 108; however, in other embodiments, each device section 106, 108 can have a distinct gate structure 140. In some such embodiments, the isolation layer 150 can extend between the respective channel regions 130 of the upper and lower device sections 106, 108. Also, while the upper device section 106 and lower device section 108 are illustrated in FIG. 1A as having the same overall width, various embodiments of the transistor structure 100 may be configured with different geometries in the S/D 120 to facilitate contact formation to the appropriate device section. For example, the S/D 120 of the lower device section 108 may extend beyond that of the upper device section 106 to enable making contact with the S/D from above. In yet other embodiments, electrical contacts (not shown) with the S/D 120 may be made from the top, bottom, or side of the S/D, as will be appreciated. Numerous variations and embodiments will be apparent in light of the present disclosure.

FIG. 1B shows a section taken through the gate structure 140 and perpendicular to the channel regions 130 of the upper and lower device sections 106, 108 of a plurality of devices. The gate structure 140 includes a gate dielectric 142 and a gate electrode 144, where the gate dielectric 142 is between the nanowire 132 and the gate electrode 144. An interlayer dielectric (ILD) 152 is formed over the gate electrode of each device. A work function layer 145, such as a work function metal, surrounds each nanowire 132 between the gate dielectric 142 and the gate electrode 144. The gate electrode 144 extends between and is common to the nanowires 132 in both of the upper and lower device sections 106, 108. Regions of shallow trench isolation (STI) material 115 extend into the substrate 110 between each channel region 130. While the nanowires 132 of the upper and lower device sections 106, 108 are shown in FIG. 1B as being vertically aligned, in some embodiments the nanowires of the upper device section 106 are misaligned vertically with the nanowires 132 of the lower device section 108.

The channel region 130 of the upper device section 106 includes nanowires 132a and the channel region 130 of the lower device section includes nanowires 132b. The cross-sectional shape of nanowires 132a of the upper device section 106 is different from that of the nanowires 132b in the lower device section 108. Although both nanowires 132a and 132b have a generally oval cross-sectional shape, the geometries are different in that the nanowires 132a in the upper device section 106 have a vertically elongated shape while the nanowires 132b in the lower device section 108 have a horizontally elongated shape. In some such embodiments, nanowires 132 with a vertically elongated shape (e.g., NMOS section) have a height that is at least 1.5 times the width of the nanowire body, including at least 2 times, at least 3 times, at least 5 times, at least 10 times, or other amount. The increased vertical dimension relative to the horizontal dimension emphasizes vertical compressive strain associated with the difference in lattice constant between the nanowire 132 body and the gate electrode 144. The vertically elongated shape approximates the geometry of a fin, providing the benefit for NMOS device of vertical strain for increased electron mobility. Reducing the horizontal component of lattice strain is beneficial in some materials. In silicon devices, for example, vertical compressive strain is advantageous to increase drive current, as will be appreciated.

The nanowires 132b in the lower device section 108 have a proportional or horizontally elongated shape, such as a circle, square, oval, flattened oval, or horizontal rectangle. For example, the nanowires 132b in the lower device section 108 have a height that is equal to or less than the width. In some such embodiments, for example, the cross-sectional height is about the same as the width. In other embodiments, the ratio of the height to width is not more than 1.0, not more than 0.5, not more than 0.2, not more than 0.1, or not more than 0.05. For PMOS operation in silicon-based channel materials (e.g., Si, SiGe), for example, the component of horizontal strain is not as detrimental to performance, so the nanowire or nanoribbon can have a horizontally elongated cross-sectional shape.

In other embodiments, the geometry of the nanowire 132 cross-sectional geometry can differ in other ways, including a different area, a different shape (e.g., rectangular vs. oval), a different perimeter length, and/or a different vertical spacing between adjacent nanowires 132. By using a different geometry of the nanowires 132 in the upper device section 106 and lower device section 108, strain can be independently optimized for NMOS and PMOS device operation, as will be appreciated. Note that while the upper device section 106 is shown and described as having features consistent with an NMOS device, this is not required and the transistor structure 100 can have the polarity of the upper and lower device sections 106, 108 reversed compared to what is discussed above. Also, both upper and lower device sections 106, 108 can be of the same polarity (NMOS or PMOS), as will be appreciated.

Figure 2A:
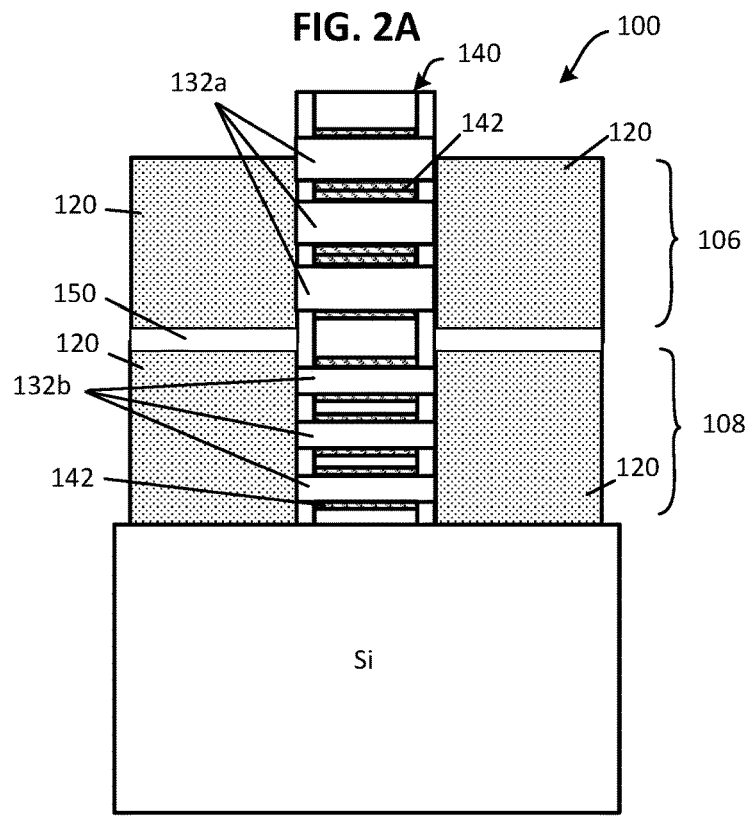
FIG. 2A illustrates a cross-sectional view taken through the gate structure of a transistor structure with an upper device section having nanowires of a first cross-sectional shape and a lower device section having nanowires of a different second cross-sectional shape, in accordance with an embodiment of the present disclosure.
Figure 2B:
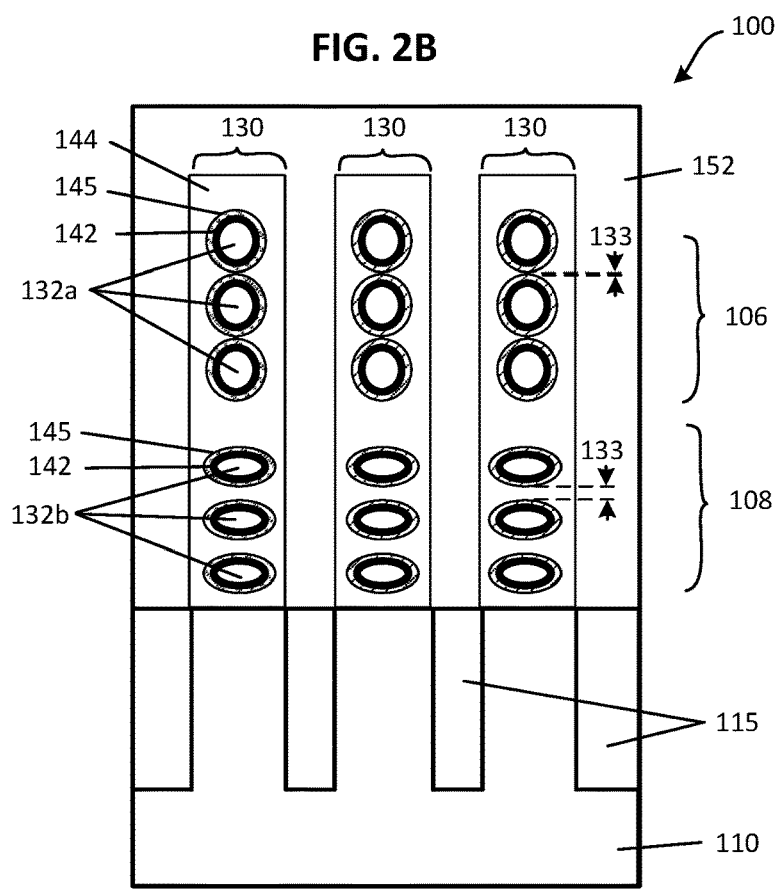
FIG. 2B illustrates a cross-sectional view of the transistor structure of FIG. 2A taken across the channel of three devices and shows the different cross-sectional shapes of the nanowires as well as different vertical spacing between nanowires in each device section, in accordance with an embodiment of the present disclosure.

Referring now to FIGS. 2A and 2B, cross-sectional views show a transistor structure 100 in accordance with another embodiment of the present disclosure. FIG. 2A shows a sectional view taken through the gate structure 140 and along the channel 130 and S/D 120. FIG. 2B is a cross-sectional view taken through the channel 130 and along the gate structure 140, showing cross-sections of the nanowires 132 in the channel 130 of devices in upper and lower device sections 106, 108. The example structure here shares features with the structure of FIGS. 1A and 1B. Accordingly, the description of this embodiment will focus on the differences.

In the example transistor structure 100 of FIGS. 2A and 2B, the vertical spacing 133 between adjacent nanowires 132 is different in the upper device section 106 compared to that in the lower device section 108. For example, the vertical spacing 133 between adjacent nanowires 132 can be reduced so that the work function layer 145 of adjacent nanowires 132 is closely adjacent (e.g., spaced less than 5 nm, less than 3 nm, less than 2 nm, or less than 1 nm). In other embodiments, the work function layer 145 on one nanowire 132 makes contact or merges with the work function layer 145 of an adjacent nanowire 132. By reducing or eliminating the contact area of the work function layer 145 with the gate electrode 144 along the horizontal portions of the nanowires 132, the horizontal component of lattice strain can be reduced. Similarly, reducing the vertical thickness of the work function layer 145 along generally horizontal portions of the nanowire 132 reduces the horizontal component of lattice strain associated with interface between the work function layer 145 and the gate electrode 144. Using these techniques in a stacked transistor configuration enables independent optimization of lattice strain in NMOS devices and PMOS devices, as will be appreciated.

In some embodiments, the vertical spacing 133 between nanowires 132 in the lower device section 108 is at least 1.5 times that in the upper device section 106 (or vice versa), including at least 2 times, at least 3 times, at least 4 times, at least 5 times, at least 10 times, and other amounts. In other embodiments, the vertical spacing 133 between adjacent nanowires 132 of a given device section 106, 108 can less than the vertical height of the nanowires 132. For example, when the work function layer 145 of adjacent nanowires 132 does not merge or contact, the vertical spacing in the upper device section 106 can be at most one half, one third, one quarter, one fifth, one tenth, one twentieth, one fiftieth, one hundredth, or other amount of the vertical dimension of a nanowire 132. Note that in some embodiments, nanowires 132 of a given device section 106, 108 may have inconsistencies in vertical or horizontal dimension. In such case, an average value can be used as representative for comparison purposes, as will be appreciated. The difference in vertical spacing 133 between nanowires 132 in device sections 106, 108 can be used alone or in combination with differences in the cross-sectional shape (or other geometric differences) as discussed above with reference to FIGS. 1A and 1B.

Figure 3A:
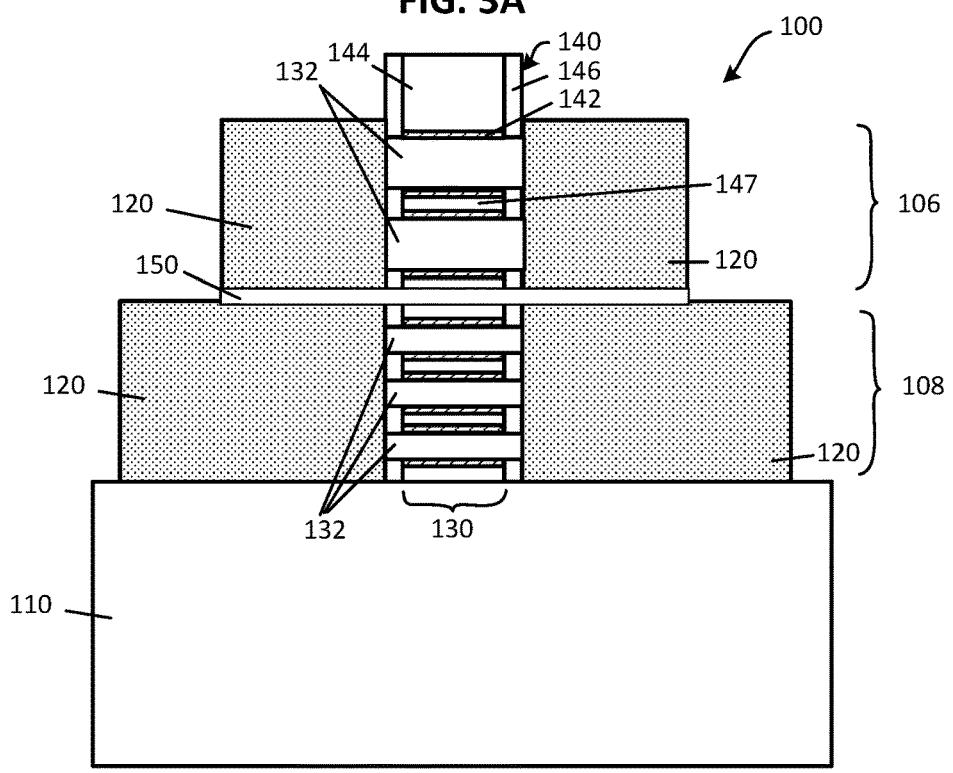
FIG. 3A illustrates a cross-sectional view taken through the gate structure of a transistor structure with an upper device section having nanowires of a first cross-sectional shape and a lower device section having nanowires of a different second cross-sectional shape, in accordance with another embodiment of the present disclosure.
Figure 3B:
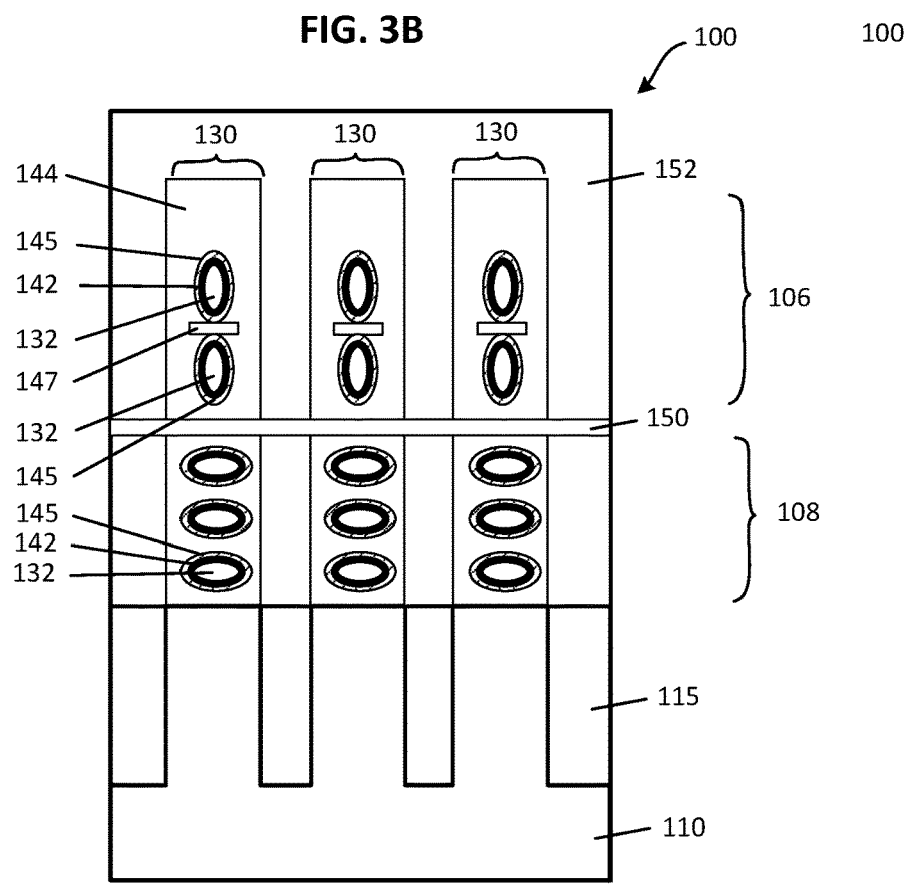
FIG. 3B illustrates a cross-sectional view of the transistor structure of FIG. 3A taken across the channel of three devices and showing the different cross-sectional shapes of the nanowires as well as a void between nanowires in the upper device section, in accordance with an embodiment of the present disclosure.

Turning now to FIGS. 3A and 3B, cross-sectional views show a transistor structure 100 in accordance with another embodiment of the present disclosure. FIG. 3A shows a sectional view taken through the gate structure 140 and along the channel 130 and S/D 120. FIG. 3B is a cross-sectional view taken through the channel 130 and along the gate structure 140, showing cross-sections of the nanowires 132 in the channel 130 of devices in upper and lower device sections 106, 108. Again, the description of this embodiment will focus on the differences compared to embodiments discussed above. In addition to other differences, the embodiment of FIGS. 3A and 3B is illustrated to include an isolation layer 150 that extends between the gate structures 140 of the upper and lower device sections 106, 108. Also, the extents of the S/D 120 of the upper and lower device sections 106, 108 is different to show one example configuration that facilitates processing of S/D contacts 122 (shown in FIG. 5).

In the embodiment of FIGS. 3A and 3B, another methodology is employed to reduce the horizontal component of lattice strain in the upper device section 106. Here, a void or airgap 147 is present between the work function layer 145 of vertically adjacent nanowires 132 in the upper device section 106. The airgap 147 eliminates or reduces contact between the work function layer 145 and gate electrode 144 along the top and/or bottom of adjacent nanowires 132. Lattice strain results when the lattice of one material occupies a higher energy state to conform to the lattice of another material it contacts. When a given material does not contact another such structure, the lattice is free to occupy a lower energy state or relaxed lattice in that location. Accordingly, by placing an airgap 147 along the top and/or bottom of a nanowire 132, the horizontal component of lattice strain is reduced.

In some embodiments, the airgap 147 results from the method of depositing the gate electrode 144 in combination with the vertical spacing 133 between vertically adjacent nanowires 132. For example, when the vertical spacing 133 is sufficiently small compared to the horizontal width of the nanowire 132, material accumulating on the sides of the nanowire may accumulate more quickly than on the adjacent surfaces, enabling the material to build up and close on itself. As such, the work function layer 145 or gate electrode 144 may fail to occupy the region between the top of one nanowire 132 and the bottom of the nanowire 132 above it. As such, a void or airgap 147 is encapsulated by the gate structure between vertically adjacent nanowires 132. In some embodiments, the width of the airgap 147 (e.g., as shown in FIG. 3B) is equal to or less than the cross-sectional width of the nanowire 132. When formation of the airgap 147 is dependent on vertical spacing 133 between nanowires 132, a more rectangular cross-sectional shape of the nanowires 132 may facilitate formation of an airgap that extends most or all of the width of the nanowire's cross-sectional shape, particularly when the vertical spacing 133 is relatively small. In such embodiments, the airgap can be more effective in reducing the horizontal component of lattice strain in the nanowires 132 adjacent the airgap 147. An airgap 147 present between vertically adjacent nanowires 132 can be used by itself or in combination with other differences in shape, size, spacing, or other feature to independently improve or optimize performance in the upper device section 106 and lower device section 108. Numerous variations and embodiments will be apparent in light of the present disclosure.

In another embodiment, the cross-sectional shape of the nanowires can be the same or different for n-channel and p-channel nanowires where one or more stratum of nanowires includes a void or airgap 147 along a top and/or bottom portion of the nanowires. For example, a given stratum of n-channel nanowires defines a void 147 along a bottom portion of the nanowire.

Note that while referred to as an "airgap" in this description, the airgap may contain gases different from those commonly associated with air and its composition. As such, airgap 147 can also be referred to as a void, a gas bubble, or other terminology. Also, the void or airgap 147 can be distinguished from small imperfections that may be randomly positioned throughout a material, the void or airgap 147 based on having a significantly greater size and being aligned between vertically adjacent nanowires. For example, the void or airgap 147 has a cross-sectional size of at least 1 nm wide by 1 nm tall in some embodiments. In other embodiments, the void or airgap 147 has a horizontal dimension of at least half that of the nanowires 132. Further, while illustrated as having a rectangular cross-sectional shape, such shape may not represent the actual shape and the void or airgap 147 can have other cross-sectional shapes, including round, rectangular with rounded corners, trapezoidal, oval, and irregular shapes.

Figure 4A:
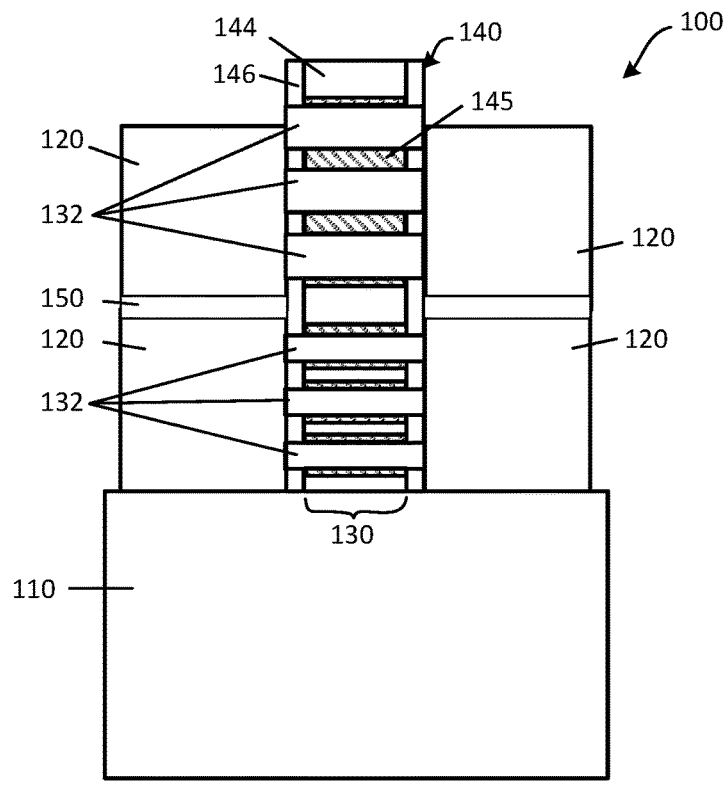
FIG. 4A illustrates a cross-sectional view taken through the gate structure of a transistor structure with nanowires in the upper and lower device sections having different cross-sectional shapes and the work function material in the upper device section being continuous between the nanowires, in accordance with another embodiment of the present disclosure.
Figure 4B:
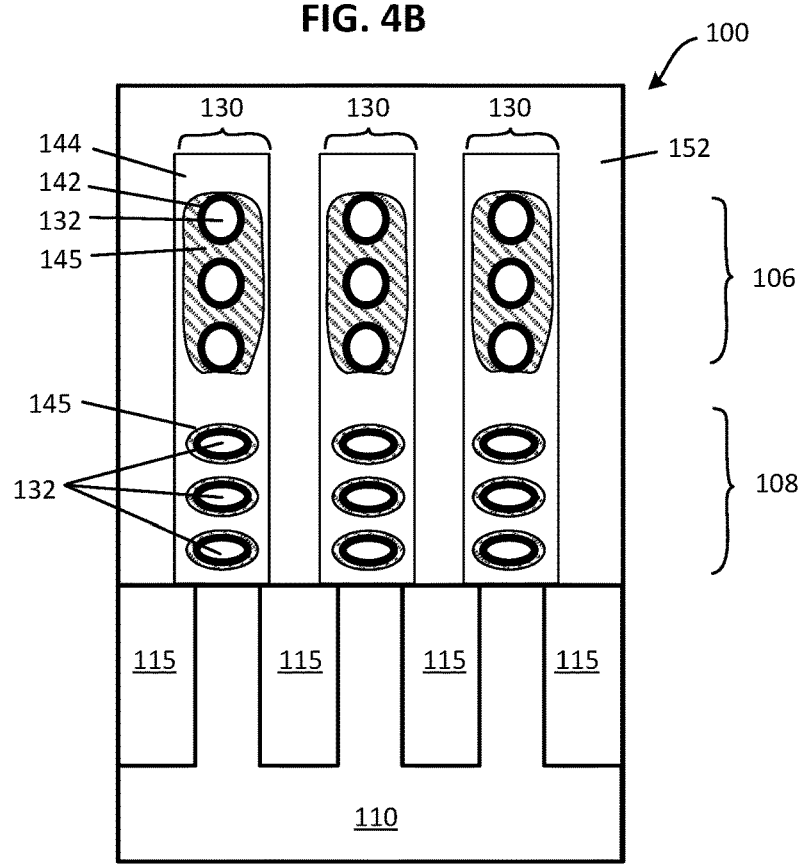
FIG. 4B illustrates a cross-sectional view of the transistor structure of FIG. 4A taken across the channel of three devices and showing the different cross-sectional shapes of the nanowires as well as different application of the work function layer, in accordance with an embodiment of the present disclosure.

Turning now to FIGS. 4A and 4B, cross-sectional views show a transistor structure 100 in accordance with another embodiment of the present disclosure. FIG. 4A shows a cross-sectional view taken through the gate structure 140 and along the channel 130 and S/D 120. FIG. 4B is a cross-sectional view taken through the channel 130 and along the gate structure 140, showing cross-sections of the nanowires 132 in the channel 130 of devices in upper and lower device sections 106, 108. Again, the description of this embodiment will focus on the differences compared to embodiments discussed above.

In the embodiment of FIGS. 4A and 4B, the work function layer 145 makes contact or merges between adjacent nanowires 132 to define a continuous structure around and between the nanowires 132 in the upper device section 106. For example, additional work function material 145 can be deposited along the sides of the nanowires 132 to form a continuous layer that wraps around a plurality (or all) of the nanowires 132 in the device section 106 and fills the space between adjacent nanowires 132. For example, the work function layer 145 fills the area between vertically adjacent nanowires 132 and extends along the nanowires 132 of the device section as a group. In one embodiment, the work function layer 145 covers the top surface of the top-most nanowire and the bottom surface of the bottom-most nanowire, though with a reduced thickness in these locations compared to the work function layer along the sides of the nanowires 132 (e.g., thickness is measured perpendicular to the surface). In some embodiments, the top-most or bottom-most nanowire 132 may exhibit incomplete coverage along a top or bottom surface, respectively. The thickness of the work function layer 145 is greater along the sides of a given nanowire 132 than along a top or bottom surface of the nanowire 132 in some embodiments. For example, the thickness of the work function layer has a thickness of 1-2 nm along the top or bottom surface and has a thickness of 5 nm or more along the sides of the nanowire 132. Accordingly, the vertical component of lattice strain can be enhanced and the horizontal component of strain reduced. Such condition may be advantageous in NMOS devices which benefit in some cases from vertical compressive strain, as will be appreciated.

In some embodiments as illustrated, the cross-sectional shape of the nanowires 132 is different in the upper and lower device sections 106, 108. For example, the cross-sectional shape of the nanowires 132 in the upper device section 106 is proportional or vertically elongated while it is horizontally elongated in the lower device section 108 (or vice versa). Employing a work function layer 145 that is continuous along a plurality of nanowires 132 can be used alone or in combination with one or more other features discussed above to independently optimize the device performance in the upper device section 106 and the lower device section 108.

Figure 5:
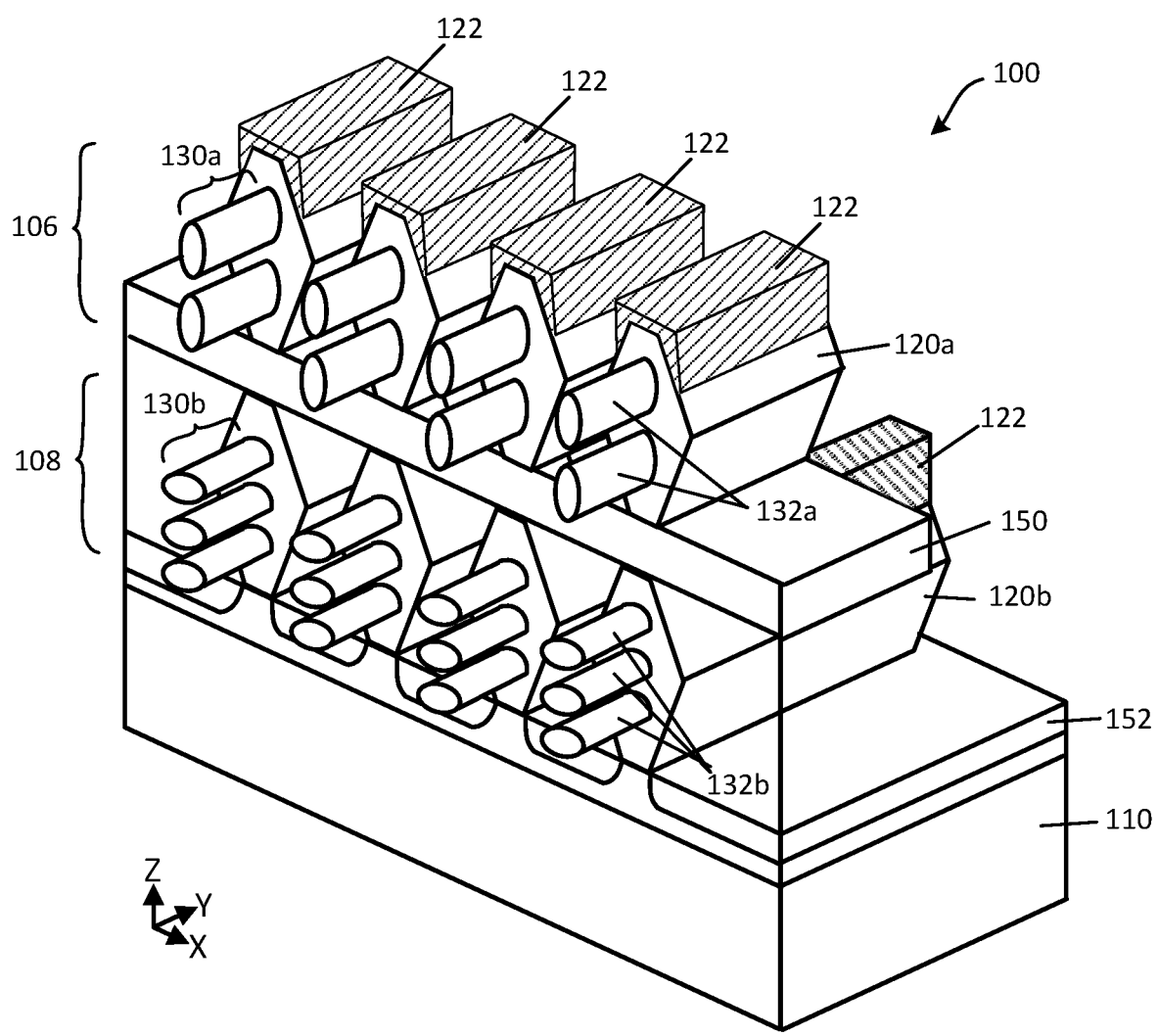
FIG. 5 is a perspective sectional view showing a portion of an example transistor structure with an upper device section having nanowires with a vertically elongated cross-sectional shape and a lower device section having nanowires with a horizontally elongated cross-sectional shape, in accordance with an embodiment of the present disclosure.

Turning now to FIG. 5, a perspective sectional view illustrates a portion of a transistor structure 100 with upper and lower device sections 106, 108, in accordance with an embodiment of the present disclosure. The example structure of FIG. 5 shows a portion of four device pairs, each of which includes an upper device section 106 and a lower device section 108. The gate structures 140 are omitted from FIG. 5 to better illustrate the channel region. The upper and lower device sections 106, 108 are vertically stacked and include nanowires 132 in the channel 130. Each device in the lower device section 108 includes three nanowires 132b that have a horizontally elongated cross-sectional shape, such as may be useful for PMOS operation in Si-based materials. Each device in the upper device section 106 includes two nanowires 132a that have a vertically elongated cross-sectional shape, such as may be useful for NMOS operation in Si-based materials. The S/D 120b of the devices in the lower device section 108 have a greater length (in the Y-axis direction) than the S/D 120a in the upper device section 106, such as to facilitate processing of S/D contacts 122. Devices in the upper device section 106 are separated and electrically isolated from those in the lower device section 108 by the isolation layer 150 that extends between them.

While the nanowires 132a of the upper device section 106 and nanowires 132b of the lower device section 108 are shown as being vertically aligned, this is not required in all embodiments. For example, nanowires 132a of the upper device section 106 may be offset in the X-axis direction from nanowires 132b of the lower device section 108 to facilitate vertical processing (e.g., etching, deposition) of the nanowires 132 in one device section 106, 108 at a time.

Figure 6:
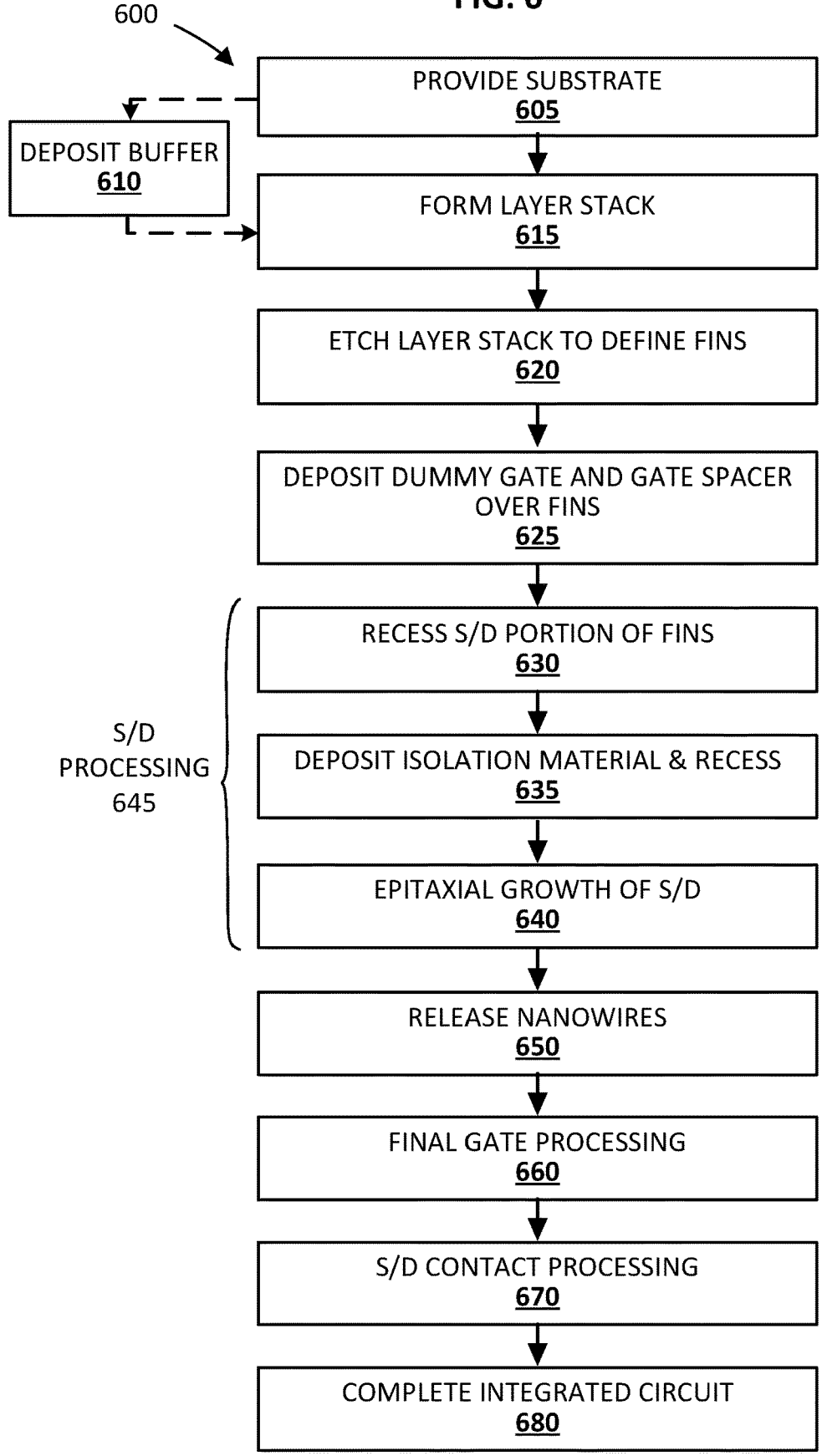
FIG. 6 is a process flow for a method of fabricating a transistor structure, in accordance with an embodiment of the present disclosure.

Turning now to FIG. 6, a flowchart illustrates a process flow for a method 600 of forming an integrated circuit with a transistor structure 100 having an upper device portion 106 and a lower device portion 108, in accordance with an embodiment of the present disclosure. Processes in method 600 include blanket deposition techniques, atomic layer deposition (ALD), wet and dry etching processes, and/or any other suitable techniques as will be apparent in light of this disclosure. Although processes in method 600 are described in the context of forming a stacked CMOS nanowire transistor structure, variations of method 600 can be used to fabricate other nanowire or nanoribbon structures, including planar transistor configurations, vertical transistor structures, FinFETs, TFETs, and the like.

In one embodiment, method 600 begins with providing 605 a semiconductor substrate 110. The substrate 110 may include any suitable material, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples. In some embodiments, the substrate 110 is bulk silicon, such as monocrystalline silicon in wafer form. In other embodiments, the substrate 110 can be any suitable semiconductor material, including silicon, silicon carbide (SiC), gallium nitride (GaN), and gallium arsenide (GaAs) to name a few examples. The substrate 110 can be selected in some embodiments from III-V materials and group IV materials. Further, the substrate 110 can comprise a semiconductor material layer deposited or grown on a structural support medium. In one particular embodiment, the substrate 110 is selected to have a (100) lattice structure in a horizontal plane of the substrate (e.g., X-Y plane as shown in FIG. 5) and a (110) lattice structure in a vertical plane (e.g., Y-Z plane as shown in FIG. 5) forming a sidewall of the nanowires 132.

The substrate 110 in some embodiments may include a Si on insulator (SOI) structure where an insulator/dielectric material (e.g., an oxide material, such as silicon dioxide) is sandwiched between two Si layers (e.g., in a buried oxide (BOX) structure), or any other suitable substrate where the top layer includes monocrystalline Si. In some embodiments, the substrate 110 may be doped with any suitable n-type and/or p-type dopant at a dopant concentration in the range of 1E16 to 1E22 atoms per cubic cm, for example. For instance, a silicon substrate can be p-type doped using a suitable acceptor (e.g., boron) or n-type doped using a suitable donor (e.g., phosphorous, arsenic) with a doping concentration of at least 1E16 atoms per cubic cm. However, in some embodiments, the substrate 110 may be undoped/intrinsic or relatively minimally doped (such as including a dopant concentration of less than 1E16 atoms per cubic cm), for example. In some embodiments, the substrate 110 is a substrate consisting essentially of Si, such as electronic grade silicon. In other embodiments, the substrate 110 may primarily include Si but may also include other material (e.g., a dopant at a given concentration). Also, note that the substrate 110 may include relatively high quality or device-quality monocrystalline Si or other material that provides a suitable template or seeding surface from which other monocrystalline semiconductor material features and layers can be formed. Therefore, unless otherwise explicitly stated, a substrate 110 as described herein is not intended to be limited to a substrate that only includes Si.

In some embodiments, the substrate 110 may have a crystalline orientation described by a Miller index of (100), (110), or (111), or its equivalents, as will be apparent in light of this disclosure. Although the substrate 110 in this example embodiment is shown for ease of illustration as having a thickness (dimension in the Z-axis direction) similar to that of other layers in the figures, the substrate 110 may be relatively much thicker than the other layers, such as having a thickness in the range of 1 to 950 microns (or in the sub-range of 20 to 800 microns), for example, or any other suitable thickness or range of thicknesses as will be apparent in light of this disclosure. In some embodiments, the substrate 110 may include a multilayer structure including two or more distinct layers that may or may not be compositionally different. In some embodiments, the substrate 110 may include grading (e.g., increasing and/or decreasing) of one or more material concentrations throughout at least a portion of the material. In some embodiments, the substrate 110 may be used for one or more other IC devices, such as diodes (e.g., light-emitting diodes (LEDs) or laser diodes), transistors (e.g., MOSFETs or TFETs), capacitors (e.g., MOSCAPs), microelectromechanical systems (MEMS), nanoelectromechanical systems (NEMS), radio frequency (RF) devices, sensors, or any other suitable semiconductor or IC devices, depending on the end use or target application. Accordingly, in some embodiments, the structures described herein may be included in a system-on-chip (SoC) application, as will be apparent in light of this disclosure.

Method 600 optionally includes depositing 610 a buffer 112 on the substrate 110. The buffer 112 can be configured to accommodate the lattice mismatch between the substrate 110 and the channel material to be subsequently grown as part of a layer stack 134. In some such embodiments, the channel material is a Group III-V material with a large lattice mismatch to the substrate 110. The buffer 112 can be deposited on the substrate 110 with an intermediate value of lattice constant between the channel material 138 and the substrate 110, resulting in improved crystal quality in the channel 130. In one embodiment, the buffer 112 includes a first layer of buffer material, such as gallium phosphide (GaP). Gallium phosphide has a lattice mismatch of only 0.36% with silicon. Gallium phosphide is also useful to overcome the transition from non-polar materials (Si) to polar materials (Group III-V) without a large difference in lattice constant.

Additional buffer layers can be grown on the first layer of buffer material with stepped or graded concentrations of one or more element, in accordance with some embodiments. For example, the buffer 112 has from 1 to n additional layers of buffer material, where the first layer has a lattice mismatch of about two percent or less with respect to the substrate, and where the nth layer of the buffer material has a lattice mismatch of about two percent or less with the channel material 138 to be grown. In one embodiment, the buffer material has a graded concentration of one or more elements. For example, the buffer 112 includes a layer of InGaP with a graded indium concentration that increases with thickness. In some such embodiments, the indium concentration may start at a low level (e.g., 0 to 10 atomic percent) and/or may increase to a higher level (e.g., to 75 atomic percent).

In other embodiments, the buffer 112 can include a plurality of layers of buffer material deposited in a stepped concentration of certain species for gradual differences in lattice constant. In one such embodiment used for channel of indium phosphide (InP), layers of $In_xGa_{1-x}P$ are used and include two or more layers of buffer material with increasing concentration of indium in each layer. For example, each layer of buffer material has a lattice constant that differs by no more than about 2% compared to the layer on which it is deposited. More or fewer buffer layers can be used, depending on the acceptable limit of defects and lattice constants of the various materials, as will be appreciated. In some embodiments, the buffer 112 has a thickness not greater than 500 nm, including 400 nm or less, 300 nm or less, and 200 nm or less. In some embodiments, one or more layers of the buffer material may be doped with a suitable dopant (e.g., boron, phosphorous, and/or arsenic). In embodiments where the buffer material is doped, it may be n-type doped (e.g., with phosphorous or arsenic) or p-type doped (e.g., with boron) at a dopant concentration in the range of 1E16 to 1E22 atoms per cubic cm, for example.

Figure 7:
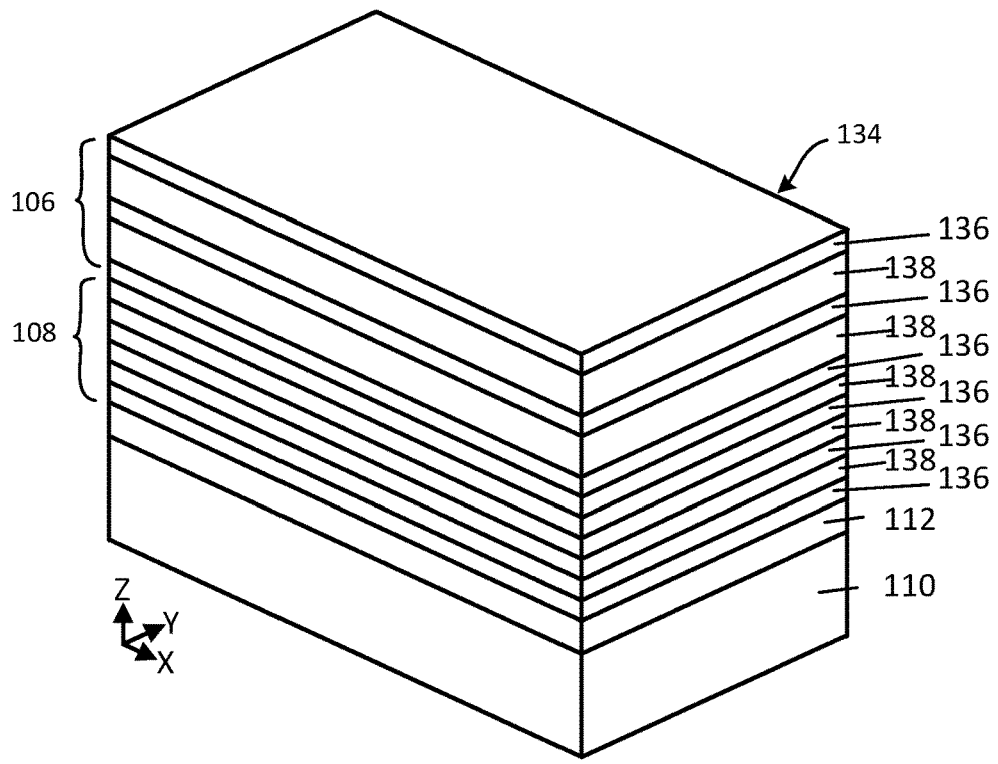
FIG. 7 is a perspective view showing a layer stack of sacrificial material and channel material, in accordance with an embodiment of the present disclosure.

Method 600 continues with depositing 615 a layer stack 134 on the substrate 110 (or on the buffer 112, when present). The layer stack 134 has alternating layers of a sacrificial material 136 and channel material 138, in accordance with some embodiments. FIG. 7 illustrates a perspective view of an example structure with a silicon substrate 110, a buffer 112, and a layer stack with alternating layers of 134 of sacrificial material 136 and channel material 138.

In one embodiment, alternating blanket layers of sacrificial material 136 and channel material 138 can be formed using layer-by-layer epitaxial growth, where the sacrificial material 136 can subsequently be removed to release nanowires, nanoribbons, or nanosheets of the channel material 138. In one embodiment, a first layer of sacrificial material 136 is formed directly on the substrate 110, followed by forming a first layer of channel material 138 directly on the first layer of sacrificial material 136, and followed similar fashion by depositing additional layer pairs of sacrificial material 136 and channel material 138, and finally followed by depositing a top layer of sacrificial material 136. For example, when the first (bottom) layer and the last (top) layer of the layer stack 134 is the sacrificial material 136, layers of channel material 138 are sandwiched between layers of the sacrificial material 136. In one example embodiment, the sacrificial material 136 is silicon germanium (SiGe) and the channel material 138 is silicon (Si) or vice versa. In another embodiment that utilizes a buffer 112, the sacrificial material is indium gallium arsenide (InGaAs) and the channel material 138 is indium phosphide (InP). Other pairs of sacrificial material 136 and channel material 138 can be used, as will be appreciated. Optionally, the channel material 138 can be doped during epitaxy with a suitable dopant at a desired concentration, as will be appreciated.

Layer stack 134 can be formed using any suitable techniques, such as one or more deposition or epitaxial growth processes (e.g., CVD, PVD, ALD, VPE, MBE, LPE), melt regrowth, and/or any other suitable processing, as will be appreciated in light of the present disclosure. In some embodiments, the sacrificial material 136 and the channel material 138 are deposited as blanket layers. Additional processing can be performed after depositing each layer as needed, such as cleaning and polishing one material prior to deposition of the next material. In some embodiments, a given material of the layer stack 134 has a vertical thickness (dimension in the Z-axis direction) in the range of 2 nm to 50 nm (or in a subrange of 2-20, 5-45, 5-40, 5-35, 5-30, 5-25, 5-20, 5-15, 5-10, 10-40, 10-30, 10-20, 15-40, 15-30, 15-20, 20-40, 20-30 and 30-40 nm) and/or a maximum vertical thickness of at most 50, 40, 30, 25, 20, 15, or 10 nm, for example.

Other vertical thickness requirements or thresholds can be used, as will be apparent in light of this disclosure. The vertical thickness of each layer can be selected to provide the desired geometry of the nanowire, nanoribbon, or nanosheet to be subsequently formed. The materials in the layer stack 134 need not have the same vertical thickness from layer to layer nor among layers of a given material. For example, the thickness (in the Z-axis direction) of a given layer can be controlled to provide the desired geometry or vertical spacing 133 between nanowires 132 to be formed. As shown in FIG. 7, the channel material 138 has a greater layer thickness in the upper device portion 106 compared to the channel material 138 in the lower device portion 108. Thus, for example, subsequently formed nanowires can have vertical spacing and vertical nanowire dimensions that may be the same or different for each nanowire, as will be appreciated.

In some embodiments, multiple different channel materials 138 may be deposited on different areas of the substrate, such as for CMOS applications, for example. For instance, a first channel material 138 may be formed on a first area of the substrate to be used for one or more PMOS devices and a second channel material 138 may be formed on a second area of the substrate to be used for one or more NMOS devices. For instance, in some such embodiments, the first channel material may include a n-type group III-V or group IV material and a second channel material may include a p-type group III-V or group IV material.

In some embodiments employing multiple different channel materials, the first channel material 138 may include group IV semiconductor material (e.g., Si, SiGe, Ge, etc.) and the second channel material 138 may include group III-V semiconductor material (e.g., GaAs, InGaAs, InP, etc.). In general, a given channel material may include monocrystalline group IV semiconductor material and/or group III-V semiconductor material. For instance, in a beaded-fin transistor configuration, the channel region may include both group IV semiconductor material (e.g., for the broader or narrower portions) and group III-V semiconductor material (e.g., for the other of the broader or narrower portions). Note that the multiple different channel materials may be formed using any suitable techniques, such as masking, depositing, and removing the masking as desired to form any number of compositionally different channel materials. Numerous different channel material configurations and variations will be apparent in light of this disclosure.

Method 600 continues with defining 620 fins 160 from the layer stack 134, in accordance with some embodiments. In one example, regions of the layer stack 134 to be processed 620 into fins are masked, followed by etching the surrounding regions to define one or more fins 160. For instance, an anisotropic etch proceeds substantially vertically (e.g., ±5°) through the layer stack 134 to define isolation trenches between adjacent fins 160. In some embodiments, the etch process proceeds into the substrate 110 to define a fin that includes the subfin portion 162 of substrate material and/or buffer material (when present). Above the subfin portion 162, the fin 160 has alternating layers of sacrificial material 136 and channel material 138 as deposited in the layer stack 134.

Figure 8:
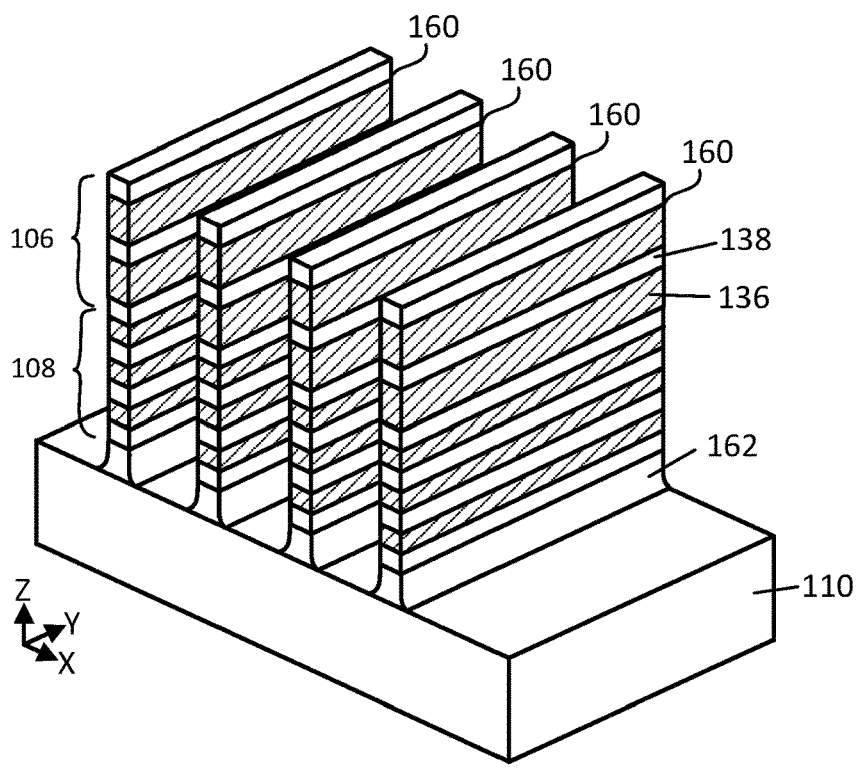
FIG. 8 is a perspective view showing the layer stack of FIG. 7 after etching to define fins, in accordance with an embodiment of the present disclosure.

In some embodiments, the etch process defines groups of parallel fins 160 extending vertically up from the substrate 110. FIG. 8 illustrates a perspective view of one example structure showing fins 160 extending up from the substrate 110. Each fin 160 includes a subfin portion 162. Each fin 160 has alternating layers of sacrificial material 136 and channel material 138 from the layer stack 134. In other embodiments, the etch defines planar or 3D transistor structures having an H shape, where the channel region 130 corresponds to the horizontal beam of the H extending between the source and drain regions 120 represented by a rectangular shape connected by the channel region 130 extending therebetween.

In some embodiments, each fin 160 may include a vertical fin height (dimension in the Z-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical fin height of at most 500, 450, 400, 350, 300, 250, 200, 150, 100, or 50 nm, for example. In some embodiments, each fin may include a horizontal fin width (dimension in the X-axis direction) in the range of 2-50 nm (or in a subrange of 2-5, 2-10, 5-10, 5-20, 5-30, 5-50, 10-20, 10-30, 10-50, 20-30, 20-50, or 30-50 nm) and/or a maximum horizontal fin width of at most 50, 30, 20, 10, or 5 nm, for example. In some embodiments, the ratio of fin height to fin width may be greater than 1, such as greater than 1.5, 2, 2.5, 3, 3.5, 4, 4.5, 5, 6, 7, 8, 9, 10, 15, 20, or greater than any other suitable threshold ratio, as will be apparent in light of this disclosure. Other suitable materials and thickness values/ranges/thresholds will be apparent in light of this disclosure.

In some embodiments, the substrate 110 (or buffer material, when present) may be oppositely type doped relative to the overlying channel material 138 to provide a tunnel diode configuration to help reduce or eliminate parasitic leakage (e.g., subthreshold leakage). For instance, in some embodiments, the substrate may be intentionally p-type doped (e.g., with a doping concentration of at least 1E16, 5E16, 1E17, 5E17, 1E18, 5E18, or 1E19 atoms per cubic cm) if the overlying material is to be n-type doped, or vice versa.

Method 600 continues with defining 625 a gate structure 140 in contact with the top and sides of each fin 160. In one embodiment, process 625 includes initially filling trenches between the fins 160 with shallow trench isolation (STI) material 152. Such processing can include depositing the STI material 152, planarizing/polishing the structure (e.g., via CMP), and recessing the polished STI material to expose the layer stack 134 portion of the fins 160 above the subfin portion 162. In some embodiments, deposition of the STI material 152 may include any suitable deposition techniques, such as those described herein (e.g., CVD, ALD, PVD), or any other suitable deposition process. In some embodiments, STI material 152 may include any suitable electrical insulator material, such as one or more dielectric, oxide (e.g., silicon dioxide), and/or nitride (e.g., silicon nitride) materials. In some embodiments, the STI material 152 may be selected based on the material of the substrate 110. For example, the STI material 152 may be selected from silicon dioxide or silicon nitride based on the use of a Si substrate 110.

In accordance with some embodiments, the gate structure 140 is a dummy gate structure formed on the channel region 130 of the fins 160. In one embodiment, the gate structure 140 includes a dummy gate electrode 142, gate spacers 146, and an optional hardmask 148. In this example, defining 625 the gate structure 140 is performed in accordance with a gate-last process flow. In some embodiments, the dummy gate electrode 142 is made of polysilicon or other suitable material, as will be appreciated. A gate-last fabrication process may utilize a dummy gate structure 140 to allow for replacement gate processing, while a gate-first fabrication process may form the final gate structure in the first instance; the final gate structure can be formed after the S/D regions 120 have been processed. In other embodiments, the techniques may be performed using a gate-first process flow. In either a gate-last or a gate-first process flow, the end structure will include the final gate stack, as will be apparent in light of this disclosure. The dummy gate structure can define the channel region 130 and source/drain (S/D) regions 120 of each fin 160, where the channel region 130 is under the gate structure 140 (whether dummy or final gate stack), and the source and drain regions 120 are on either side of the gate structure 140 and connect to the channel region 130.

Process 625 includes forming gate spacers 146 on opposite sides of the dummy gate electrode 144. The gate spacers 146 may include any suitable material, such as any suitable electrical insulator, dielectric, oxide (e.g., silicon oxide), and/or nitride (e.g., silicon nitride) material, as will be apparent in light of this disclosure. In one embodiment, the gate spacers 146 are formed of silicon nitride ($Si_3N_4$). Note that in some embodiments, a hardmask 148 may be formed over the dummy gate structure 140 to protect the dummy gate electrode 144 and gate spacers 146 during subsequent processing, for example. In some embodiments, the hardmask 148 is formed on top of the dummy gate electrode between the gate spacers 146.

Figure 9:
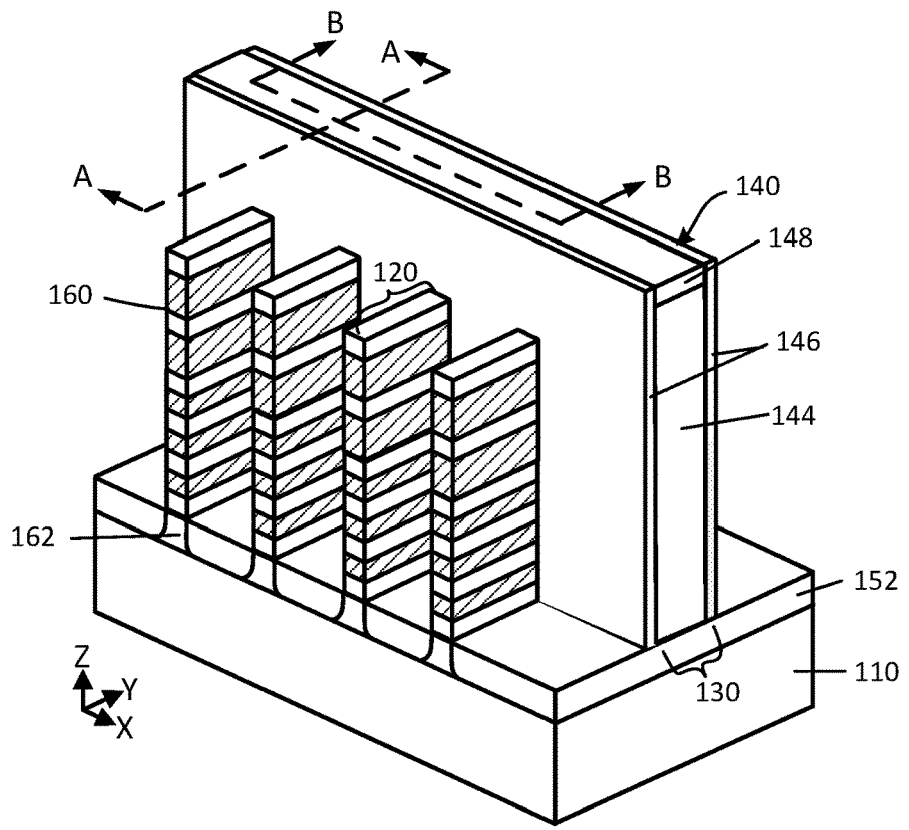
FIG. 9 is a perspective view showing the fins of FIG. 8 after forming a gate structure, in accordance with an embodiment of the present disclosure.

FIG. 9 illustrates a perspective view of an example structure with fins 160 extending up from substrate 110 and STI material 152 between the subfin portion 162 of adjacent fins 160. A dummy gate structure 140 is formed in contact with the top and sides of each fin 160, defining the channel region 130 below it and defining source and drain 120 regions on opposite sides of the gate structure 140. The gate structure 140 includes a dummy gate electrode 144, gate spacers 146 on opposite lateral faces of the gate electrode 144, and a hardmask 148.

Method 600 continues with processing 645 the source/drain 120 using any suitable techniques, in accordance with an embodiment of the present disclosure. In one embodiment, processing 645 the source and drain 120 is performed according to a replacement S/D approach. In one such embodiment, processing 645 begins by recessing 630 at least a portion of the exposed source and drain 120 regions of the fins 160. In some embodiments, all of the layer stack 134 is removed in the source and drain 120 regions of the fin 160, in addition to some amount of the substrate 110 or other material below the layer stack 134. In other embodiments, the etch process stops short of completely removing the entire layer stack 134, leaving behind a stub or residual portion of the layer stack in the S/D 120 region. For example, the stub is part of a bottom or first layer of sacrificial material 136. The S/D etch exposes ends of the nanowire/nanoribbon channel material 138 at the outside surface of the gate spacers 146. The resulting structure may be masked as needed for deposition or growth of replacement source/drain material, as discussed in more detail below. In other embodiments, processing 645 the source and drain 120 does not recess or does not fully recess the layer stack 134 in the source/drain 120 regions of the fins; instead, the material in the layer stack 134 at the source/drain regions 120 is converted to final source/drain 120 by doping, implantation, and/or cladding with a source/drain material or other suitable processing, for example.

Figure 10:
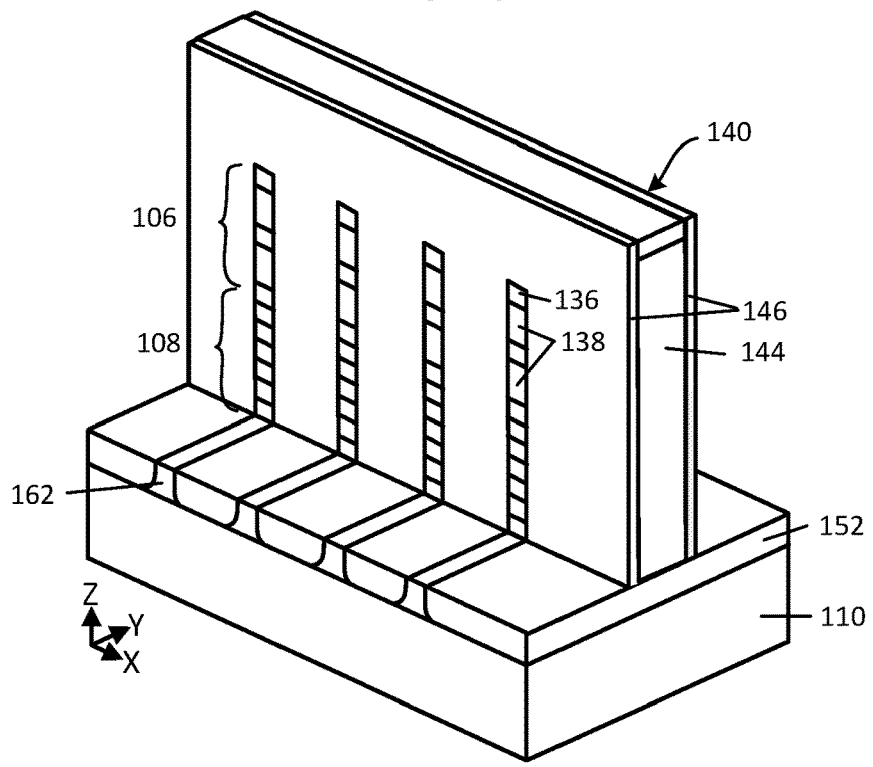
FIG. 10 is a perspective view showing the structure of FIG. 9 after recessing the exposed regions of the fins, in accordance with an embodiment of the present disclosure.

FIG. 10 illustrates a perspective view of an example structure after recessing the layer stack 134 in the source and drain 120 regions. The layer stack 134 in the S/D 120 regions has been recessed into the buffer 112. In some embodiments, the S/D regions 120 can be further recessed, such as to the top surface of the substrate 110 or into the substrate 110. The channel material 138 is exposed at the face of the gate spacer 146 for both the upper device section 106 and lower device section 108.

For a stacked transistor structure 100 with an upper device portion 106 and a lower device portion 108, for example, processing 645 the source and drain 120 of the lower device portion 108 may be performed first, followed by processing 645 the source and drain 120 of the upper device portion 106. For example, process 645 includes depositing 640 a layer of STI material (e.g., an oxide (e.g., $SiO_2$)), followed by recessing the STI to the top of the lower device section 108. Another isolation material (e.g., a nitride (e.g., $Si_3N_4$)) can then be deposited conformally over the STI material and the exposed portion of the upper device section 106. The STI material is then removed in the lower device section 108, such as by a wet etch process, leaving the isolation material (e.g., $Si_3N_4$) on the faces of the gate spacers 146 and over the ends of the channel material 138. By removing the STI material in the lower device section 108, the channel material 138 at the face of the gate spacer 146 is now exposed for epitaxial growth of replacement S/D material.

Process 645 continues with epitaxially growing 640 replacement S/D material using any suitable techniques, such as vapor-phase epitaxy (VPE), molecular beam epitaxy (MBE), or liquid-phase epitaxy (LPE), for example. In a stacked transistor configuration, for example, material of the source and drain regions 120 in the lower device section 108 can be epitaxially grown laterally from the channel material 138 exposed at the gate spacer 146. For example, singlecrystal material grows hemispherically outward from the exposed ends of the channel material 138. After processing the S/D 120 in the lower device section 108, a layer of STI material 152 can be deposited over the S/D 120 of the lower device section 108 in preparation for processing the S/D 120 in the upper device section 106. Optionally, an isolation material 154 can be deposited on the STI material 152, such as an oxide (e.g., $SiO_2$), nitride (e.g., $Si_3N_4$), a low-k dielectric (e.g., porous $SiO_2$ or material having a dielectric constant below 3.9), alumina, oxynitride compounds, carbonoxynitride compounds, a spin-on C-rich glass, or some other electrically insulating material. The isolation material 154 deposited on top of the lower device section 108 is generally different from that used in the upper device section 106 to allow selective etching of one of the isolation materials. The isolation material (e.g., $Si_3N_4$) on the gate spacers 146 in the upper device section 106 is removed to expose the channel material 138 in the upper device section 108. Replacement S/D 120 material can then be epitaxially grown from the exposed ends of the channel material 138 in the upper device section 108.

Figure 11:
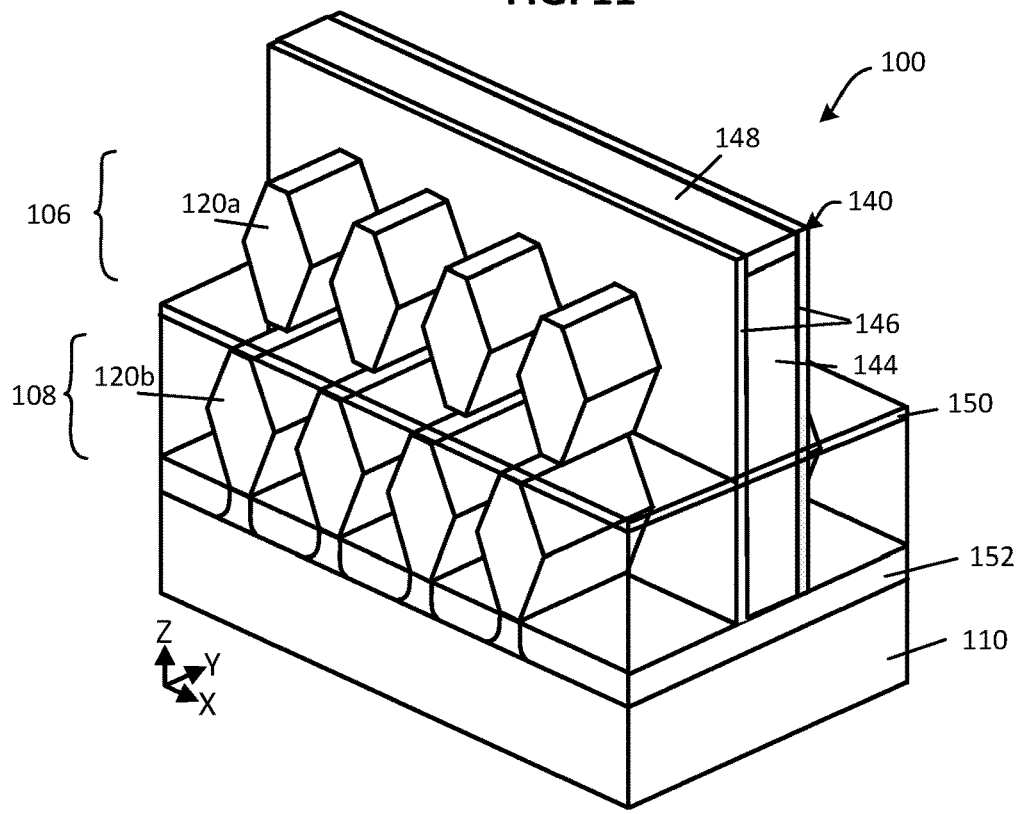
FIG. 11 is a perspective view showing the structure of FIG. 10 after processing the source and drain in the upper and lower device sections, in accordance with an embodiment of the present disclosure.

FIG. 11 illustrates a perspective view of an example transistor structure 100 after epitaxial growth of the replacement S/D 120 material in the lower device section 108 and upper device section 106. A layer of STI material 152 fills voids between S/D 120 in the lower device section 108 and isolates the S/D 120 of the upper device section 106 from the lower device section 108. Note that the source and drain 120b of the lower device section 108 extends from the gate structure 140 to a greater extent than the source and drain 120a of the upper device section 106. Such configuration is not required, but may be useful to facilitate formation of S/D contacts extending vertically down to the S/D 120 of each device section 106, 108.

In some embodiments, the source and drain 120 may be formed one polarity at a time, such as processing one of n-type and p-type S/D, and then processing the other of the n-type and p-type S/D. In some embodiments, the source and drain 120 may include any suitable doping scheme, such as including suitable n-type and/or p-type dopant (e.g., in a concentration in the range of 1E16 to 1E22 atoms per cubic cm). However, in some embodiments, at least one source or drain 120 may be undoped/intrinsic or relatively minimally doped, such as including a dopant concentration of less than 1E16 atoms per cubic cm, for example.

In some embodiments, one or more of the S/D 120 may have a multilayer structure including two or more distinct layers, for example. In some such embodiments, one or more of the layers of the S/D 120 may include grading (e.g., increasing and/or decreasing) the content/concentration of one or more materials in some or all of the S/D. For instance, in some embodiments, it may be desired to gradually increase the concentration of a given dopant or element as a given S/D 120 is formed, such as to reduce dopant diffusion. For example, the S/D has a relatively lower doping concentration near the channel region 130 and a relatively higher doping concentration near the corresponding S/D contact for improved contact resistance. Optionally, a dummy electrode can be formed in the S/D regions 120. Such dummy electrode can be subsequently removed for further processing of replacement S/D material as discussed below.

Method 600 continues with releasing 650 nanowires in the channel region. Process 650 may be performed for both the upper device section 106 and lower device section 108 at the same time. In other embodiments, releasing 650 the nanowires is performed in a multistep process where the lower device section 108 is processed separately from the upper device section 106, as will be appreciated. Process 650 is discussed here where nanowires 132 of the upper device section 106 and lower device section 108 are processed at the same time.

Process 650 may begin with removing the dummy gate electrode 144 between the gate spacers 146 to expose the channel region 130 of each fin 160. For example, a dummy gate electrode 144 of polycrystalline silicon can be removed using a wet etch process (e.g., nitric acid/hydrofluoric acid), an anisotropic dry etch, or other suitable etch process, as will be appreciated. After removing the dummy gate electrode 144, the fin-shaped layer stack 134 of alternating layers of channel material 138 and sacrificial material 136 is exposed in the channel region 130 between the gate spacers 146. The channel region 130 of the layer stack 134 extends between and contacts the source and drain 120, where ends of the layer stack 134 are protected by the gate spacers 146. The sacrificial material 136 can be removed by etch processing, such as an etch process that is selective to remove the sacrificial material (e.g., SiGe) in the layer stack, while leaving intact the channel material 138 (e.g., Si) to define nanowires 132.

Etching the sacrificial material 136 may be performed using any suitable wet or dry etching process such that the etch process selectively removes the sacrificial material 136 and leaves intact the channel material 138. After removing the sacrificial material 136, the resulting channel region 130 includes nanowires 132 extending between the epitaxial material of the source and drain 120, where ends of the nanowires 132 (e.g., Si) contact the source and drain 120 and remain at least partially protected by the gate spacers 146 wrapping around them.

Optionally, the released nanowires 132 or nanoribbons can be cleaned and/or shaped using a series of oxide formation and etchback, as will be appreciated. For example, a thin surface oxide can be formed using thermal oxidation, deposition of an oxide plus annealing, or other suitable process. A wet or dry etch process can then be used to remove the oxide. Such a sequence of oxidation and oxide removal can remove residual amounts of the sacrificial material 136 and other impurities on the channel material 138. Such cleaning and shaping process can also be useful to round corners of the nanowire cross section, thereby reducing areas of charge accumulation.

Figure 12:
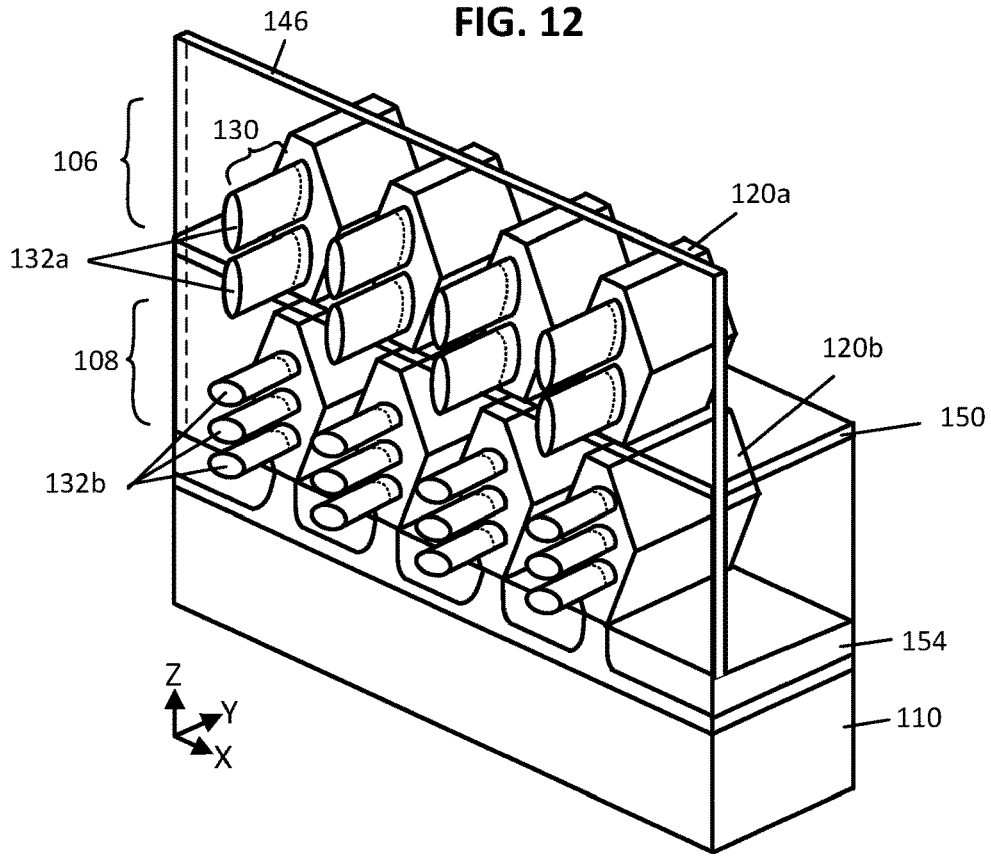
FIG. 12 is a perspective view showing the channel region in the upper and lower device sections extending from the source/drain, where the nanowires have different cross-sectional shapes.

FIG. 12 shows a part of the example structure of FIG. 11 after releasing nanowires 132 of the channel material 138. A portion of the gate structure 140 and S/D 120 shown in FIG. 11 have been removed to more clearly show the nanowires 132 in the channel 130. Ends of the nanowires 132 contact the S/D 120. The gate spacer 146 wraps around the end of each nanowire 132, which is represented by dashed lines adjacent the S/D 120. Nanowires 132a in the upper device section 106 are aligned above the nanowires 132b in the lower device section 108. The cross-sectional shape and vertical spacing 133 between nanowires 132a is different in the upper device section 106 compared to the lower device section 108. Such differences in geometry can be used to independently optimize device performance in a stacked transistor structure 100, as discussed above.

Method 600 continues with final gate processing 660. Gate processing 660 includes deposition of a gate dielectric 142 on the released nanowires/nanoribbons 132, followed by deposition of a work function layer 145 and gate electrode 144 over the gate dielectric 142, in accordance with some embodiments. In one example embodiment, the gate stack is formed using a gate-last fabrication flow, which may be considered a replacement gate or replacement metal gate (RMG) process. In embodiments utilizing a nanowire channel structure, the gate stack substantially (or completely) surrounds each nanowire body portion, such as wrapping around at least 80, 85, 90, 95% or more of each nanowire body. As discussed above for some processes, gate processing 660 may be performed at the same time for both the upper device section 106 and lower device section 108. In other embodiments, such as where upper device section 106 will be controlled separately from lower device section 108, gate processing 660 is performed in a two-part process to define distinct gate structures 140 in the lower device section 108 and in the upper device section 106.

Gate processing 660 includes depositing a gate dielectric 142 on the exposed nanowire 132 bodies in the channel region 130. The gate dielectric 142 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric 142 can be annealed to improve its quality when high-k dielectric material is used.

A work function layer 145 (e.g., a work function metal or work function metal-containing compound) can be deposited over the gate dielectric 142 in a relatively thin layer surrounding the nanowire 132 body. In some embodiments, the work function layer 145 has a thickness from 1 nm to 15 nm (e.g., 2 nm to 6 nm, 2 nm to 5 nm, 4 nm to 8 nm, or 5 nm to 10 nm). For example, the work function layer 145 has a thickness of one to five nm and defines a layer that wraps around each nanowire 132 such as shown in FIG. 1B and discussed above. In other embodiments, the work function layer 145 is deposited in a greater amount to define a continuous layer around and between adjacent nanowires 132, such as shown in FIG. 4B and discussed above. The work function layer 145 can be formed using an atomic layer deposition process or any other suitable process. When the vertical spacing 133 between nanowires 132 is sufficiently small, the process conditions of atomic layer deposition or other deposition technique can be performed such that the work function layer 145 closes on itself and encloses a void or air gap. Such an approach can be used to define a void or airgap 147 between vertically adjacent nanowires, such as shown in FIG. 3B and discussed above.

A gate electrode 144 can subsequently be formed over the work function layer 145. Any suitable technique can be used, including spin-coating or CVD deposition, for example. The gate electrode 144 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, the gate dielectric 142 and/or gate electrode 144 may include a multilayer structure of two or more material layers, for example. For instance, in some embodiments, a multilayer gate dielectric 142 may be employed to provide a more gradual electric transition from the channel material 138 to the gate electrode 144. In some embodiments, the gate dielectric 142 and/or gate electrode 144 may include grading (e.g., increasing and/or decreasing) the content or concentration of one or more materials in at least a portion of the feature(s). In some embodiments, one or more additional layers may also be present in the final gate stack, such as one or more relatively high or low work function layers and/or other suitable layers. Note that the gate dielectric 142 may also be used to form replacement gate spacers 146 on one or both sides of the nanowire body, such that the gate dielectric 142 is between the gate electrode 144 and one or both gate spacers 146, for example. Numerous different gate stack configurations will be apparent in light of this disclosure.

Method 600 continues with forming 670 source/drain contacts 122. In some embodiments, the source and drain contacts 122 can be formed 670 using any suitable techniques, such as forming vias in an ILD layer extending vertically down to the respective source/drain 120 regions, followed by depositing metal or metal alloy (or other suitable electrically conductive material) in the vias. In some embodiments, forming 670 source/drain contacts 122 may include silicidation, germanidation, III-V-idation, and/or annealing processes, for example.

In some embodiments, the source and drain contacts 122 may include aluminum or tungsten, although any suitable conductive metal or alloy can be used, such as silver, nickel-platinum, or nickel-aluminum, for example. In some embodiments, one or more of the source and drain contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance-reducing layer may be present between a given source or drain region and its corresponding source or drain contact 126, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding source or drain region 120, for example. FIG. 5, discussed above, illustrates a perspective view of part of an example transistor structure 100 with S/D contacts 122 formed on the S/D 120, in accordance with some embodiments.

Method 600 continues with completing 680 a general integrated circuit (IC) as desired, in accordance with some embodiments. Such additional processing to complete an IC may include back-end or back-end-of-line (BEOL) processing to form one or more metallization layers and/or interconnect in contact with the transistor devices formed, for example. Any other suitable processing may be performed, as will be apparent in light of this disclosure. Note that the processes in method 600 are shown in a particular order for ease of description. However, one or more of the processes may be performed in a different order or may not be performed at all (and thus be optional), in accordance with some embodiments. Numerous variations on method 600 and the techniques described herein will be apparent in light of this disclosure.

Example System

Figure 13:
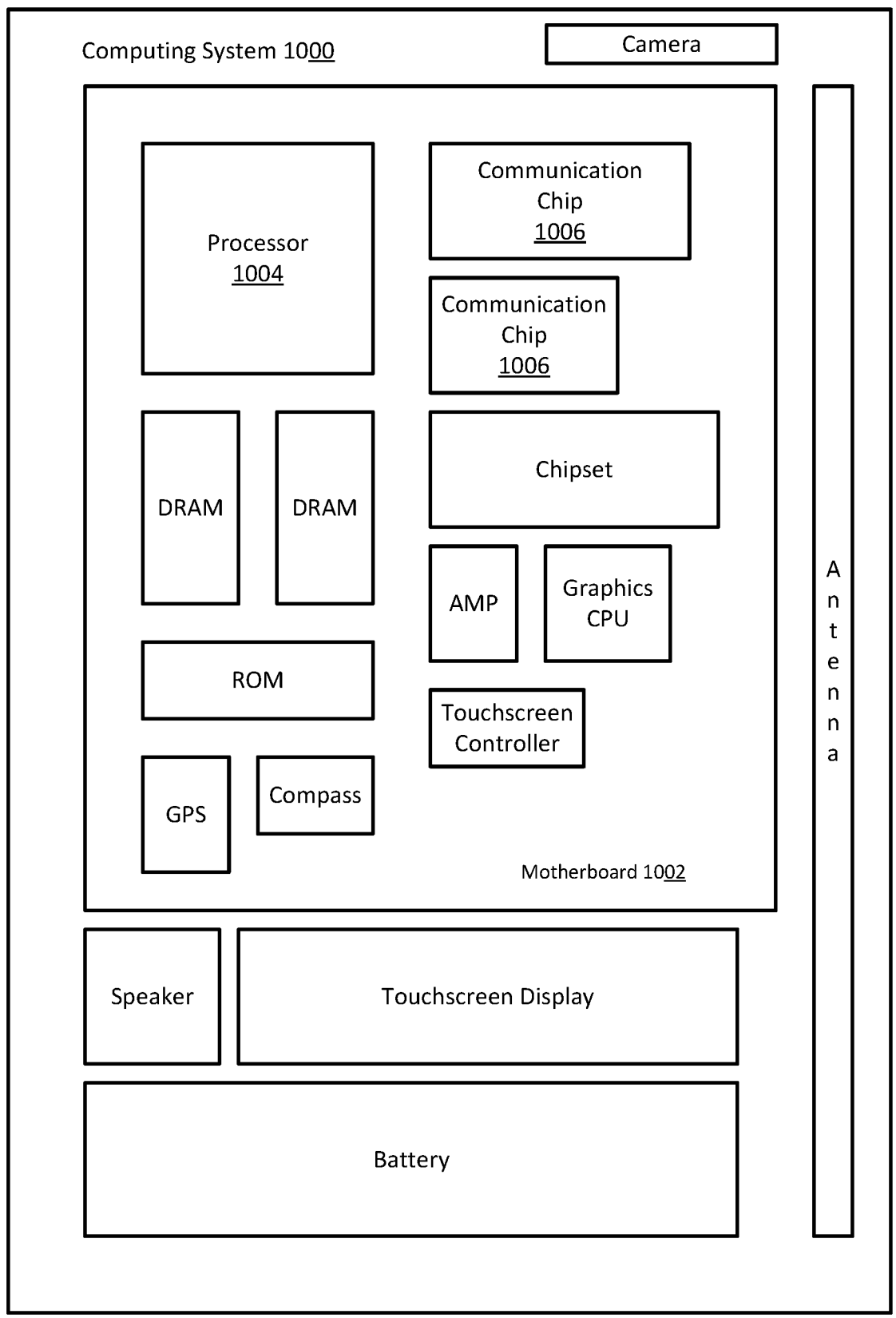
FIG. 13 illustrates an example computing system implemented with integrated circuit structures and/or transistor devices formed in accordance with some embodiments of the present disclosure.

FIG. 13 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit comprising a first transistor device region including first body of semiconductor material with a first cross-sectional shape, and a first gate structure wrapped around the first body, wherein the first gate structure includes a gate electrode and a gate dielectric, the gate dielectric positioned between the first body and the gate electrode; and a second transistor device region including a second body of semiconductor material with a second cross-sectional shape, and a second gate structure wrapped around the second body, wherein the second gate structure includes a gate electrode and a gate dielectric, the gate dielectric positioned between the second body and the gate electrode; wherein the first and second transistor device regions are arranged in a vertically stacked configuration with the first body and the second body extending horizontally; and wherein the first cross-sectional shape is different from the second cross-sectional shape.

Example 2 includes the subject matter of Example 1, wherein the first body is one a plurality of first bodies having a vertically elongated shape and the second body is one of a plurality of second bodies having a horizontally elongated shape.

Example 3 includes the subject matter of Examples 1 or 2, wherein the first cross-sectional shape has a ratio of height to width that is at least 1.5.

Example 4 includes the subject matter of any of Example 1-3, wherein the second cross-sectional shape has a ratio of height to width that is no greater than 1.0.

Example 5 includes the subject matter of Example 4, wherein the ratio of height to width that is no greater than 0.5.

Example 6 includes the subject matter of Example 4, wherein the ratio of height to width that is no greater than 0.2.

Example 7 includes the subject matter of any of Examples 1-6 further comprising a first work function layer wrapped around the first body between the gate dielectric and the gate electrode of the first body and a second work function layer wrapped around the second body between the gate dielectric and the gate electrode of the second body.

Example 8 includes the subject matter of Example 7, wherein the first work function layer comprises a metal and the second work function layer comprises a metal.

Example 9 includes the subject matter of Examples 7 or 8, wherein the first work function layer has a greater thickness along sides of the first body than along a top or a bottom of the first body.

Example 10 includes the subject matter of any of Examples 7-9, wherein the first body is one of a plurality of nanowires including a first nanowire and a second nanowire, and wherein the work function layer is a single, continuous layer around and between the first nanowire and the second nanowire.

Example 11 includes the subject matter of any of Examples 7-9, wherein the first body is one of a plurality of nanowires including a first nanowire and a second nanowire, and wherein the work function layer wrapped around the first nanowire merges with the work function layer wrapped around the second nanowire.

Example 12 includes the subject matter of any of Examples 1-11, wherein the first body is one of a plurality of nanowires including a first nanowire and a second nanowire, the first gate structure defining a void vertically aligned between the first nanowire and the second nanowire.

Example 13 includes the subject matter of any of Examples 1-9, wherein the first body is one of a plurality of first nanowires vertically stacked with a first vertical spacing therebetween, and the second body is one of a plurality of second nanowires vertically stacked with a second vertical spacing therebetween, the second vertical spacing being different from the first vertical spacing.

Example 14 includes the subject matter of Example 13, wherein the plurality of first nanowires includes a first nanowire and a second nanowire, and wherein the work function layer wrapped around the first nanowire merges with the work function layer wrapped around the second nanowire.

Example 15 includes the subject matter of any of Examples 1-14, wherein a cross-sectional area of the first body is greater than a cross-sectional area of the second body.

Example 16 includes the subject matter of Examples 1-15, wherein a perimeter length of the cross-sectional shape of the second body is less than 40 nm.

Example 17 includes the subject matter of any of Examples 1-16, wherein the first body and the second body comprise (i) a Group IV semiconductor material or (ii) a Group III-V semiconductor material.

Example 18 includes the subject matter of Example 17, wherein the first body and the second body comprise (i) gallium or (ii) gallium and arsenic.

Example 19 includes the subject matter of Example 17, wherein the first body and the second body comprise (i) silicon or (ii) silicon and germanium.

Example 20 includes the subject matter of Example 19, wherein the first body or the second body comprises $Si_{1-x}Ge_x$ with $x \leq 0.3$.

Example 21 includes the subject matter of Examples 19 or 20, wherein the first body and/or the second body comprise silicon with a (100) lattice structure in a horizontal plane.

Example 22 includes the subject matter of Example 21, wherein a sidewall of the first body and/or the second body has a (110) lattice structure.

Example 23 includes the subject matter of any of Examples 1-22, wherein a crystal lattice of the first body exhibits greater vertical strain than a crystal lattice of the second body.

Example 24 includes the subject matter of Example 23, wherein the vertical strain is compressive strain.

Example 25 includes the subject matter of any of Examples 1-24, further comprising a substrate including silicon and having a (100) crystal structure in a horizontal plane.

Example 26 includes the subject matter of any of Examples 1-25, wherein the first transistor device region includes one or more NMOS device and the second device region includes one or more PMOS device.

Example 27 is a transistor structure comprising at least one first body of semiconductor material extending horizontally between and connecting a first source and a first drain; at least one second body of semiconductor material extending horizontally between and connecting a second source and a second drain, the at least one second body arranged with the at least one first body in a spaced-apart vertical stack; a first gate structure wrapped around the at least one first body, the first gate structure comprising a gate electrode and a gate dielectric wherein the gate dielectric is positioned between the gate electrode and each of the at least one first body; and a second gate structure wrapped around the at least one second body, the second gate structure comprising a gate electrode and a gate dielectric wherein the gate dielectric is positioned between the gate electrode and each of the at least one second body; wherein the at least one first body has a first cross-sectional shape and the at least one second body has a second cross-sectional shape, the first cross-sectional shape having a greater height than width and the second cross-sectional shape having a greater width than height.

Example 28 includes the subject matter of Example 27, wherein the first gate structure includes a work function layer wrapped around the at least one first body between the gate dielectric and the gate electrode.

Example 29 includes the subject matter of Example 28, wherein the work function layer has a greater thickness along a side of the at least one first body than along a top of the at least one first body.

Example 30 includes the subject matter of Examples 28 or 29, wherein the at least one first body includes a first nanowire and a second nanowire, and wherein the work function layer wrapped around the first nanowire merges with the work function layer wrapped around the second nanowire.

Example 31 includes the subject matter of any of Examples 27-30, wherein the at least one first body and the at least one second body are selected from a nanowire, a nanosheet, and a nanoribbon.

Example 32 includes the subject matter of any of Examples 2731, wherein the first cross-sectional shape has a ratio of height to width of at least 1.5.

Example 33 includes the subject matter of Example 32, wherein the ratio is at least 2.

Example 34 includes the subject matter of Example 32, wherein the ratio is at least 5.

Example 35 includes the subject matter of Example 32, wherein the ratio is at least 10.

Example 36 includes the subject matter of any of Examples 32-35, wherein a ratio of height to width of the second cross sectional shape is 0.5 or less.

Example 37 includes the subject matter of Example 36, wherein the ratio of height to width of the second cross sectional shape is 0.25 or less.

Example 38 includes the subject matter of Example 36, wherein the ratio of height to width of the second cross sectional shape is 0.1 or less.

Example 39 includes the subject matter of any of Examples 27-38, wherein the first cross-sectional shape and the second cross-sectional shape are selected from a circle, an oval, a rectangle, a rectangle with rounded corners, and a trapezoid.

Example 40 includes the subject matter of any of Examples 27-39, wherein the first gate structure is distinct from the second gate structure.

Example 41 includes the subject matter of any of Examples 27-40, wherein the at least one first body and the at least one second body are vertically aligned.

Example 42 includes the subject matter of any of Examples 27-41, wherein the at least one first body includes a first nanowire spaced vertically above a second nanowire, and wherein the first gate structure defines a void between the first nanowire and the second nanowire.

Example 43 includes the subject matter of Example 42, wherein the void has a cross-sectional width at least two nm.

Example 44 includes the subject matter of Example 43, wherein the void has a cross-sectional height of at least one nm.

Example 45 is a CMOS transistor structure comprising the transistor structure of any of claims 27-44.

Example 46 includes the subject matter of Example 45, wherein the at least one first body is part of a PMOS transistor and the at least one second body is part of an NMOS transistor.

Example 47 is a method of forming an integrated circuit with at least one transistor, the method comprising providing a substrate comprising monocrystalline silicon; depositing a superlattice on the buffer structure, the superlattice having alternating layers of a first semiconductor material and a second semiconductor material compositionally different from the first semiconductor material, the superlattice including a first section in which layers of the first semiconductor material have a first thickness and a second section in which layers of the first semiconductor material have a second thickness different from the first thickness, the second section vertically above or below the first section; defining fins from the superlattice; forming a gate structure on the fins, the gate structure in contact with sides and a top of each of the fins, wherein the gate structure defines a channel region under the gate structure; recessing the fins on opposite sides of the gate structure to expose ends of the first semiconductor material at sides of the gate structure; epitaxially growing a first source and a first drain from ends of the first semiconductor material in the lower section; epitaxially growing a second source and a second drain from ends of the first semiconductor material in the upper section; removing the second semiconductor material from the channel region of the fins to define nanowires of the first semiconductor material in the first section having a ratio of cross-sectional height to width of at least 1.5 and defining nanowires of the first semiconductor material in the second section having the ratio of height to width no greater than 1.0; and forming a gate structure wrapped around the nanowires, the gate structure including a gate electrode, a work function layer, and a gate dielectric, wherein the gate dielectric is between each of the nanowires and the gate electrode and wherein the work function layer wraps around the nanowires between the gate dielectric and the gate electrode.

Example 48 includes the subject matter of Example 47, wherein a lattice of nanowires in the first section exhibits vertical compressive strain.

Example 49 includes the subject matter of Example 47 or 48, wherein providing the substrate includes selecting the silicon to have a (100) lattice structure in a horizontal plane of the substrate.

Example 50 includes the subject matter of Example 49, wherein the silicon has a (110) lattice structure along a sidewall of the nanowires.

Example 51 includes the subject matter of any of Examples 47-51, wherein forming the gate structure wrapped around the nanowires includes depositing the work function layer to define a continuous structure around and between a plurality of nanowires in the first section.

Example 52 includes the subject matter of Example 51, wherein forming the gate structure wrapped around the nanowires includes depositing the work function layer with a greater thickness along sides of the nanowires than along a top or bottom of the nanowires.

Example 53 includes the subject matter of any of Examples 47-52, wherein forming the gate structure wrapped around the nanowires includes defining a void between vertically adjacent nanowires in the first section.

Example 54 includes the subject matter of any of Examples 44-53 further comprising processing the nanowires in the first section to have a vertically elongated cross-sectional shape and defining the nanowires in the second section to have a horizontally elongated cross-sectional shape.

Example 55 includes the subject matter of any of Examples 47-54 further comprising processing the nanowires in the first section to have a first cross-sectional shape and defining the nanowires in the second section to have a second cross-sectional shape different from the second cross-sectional shape.

Example 56 is an integrated circuit comprising the transistor structure of any of claims 27-44.

Example 57 includes the subject matter of Example 56, wherein the transistor structure includes an n-channel transistor comprising the at least first body and a p-channel transistor comprising the at least one second body.

Example 58 includes the subject matter of Example 57 further comprising a complementary metal-oxide-semiconductor (CMOS) circuit including the n-channel transistor and the p-channel transistor.

Example 59 is a computing system comprising the integrated circuit of any of claims 1-26 or the transistor structure of any of claims 27-44.

Example 60 includes the subject matter of Example 59 further comprising a processor.

Example 61 includes the subject matter of any of Examples 59-60 further comprising a memory structure.

Example 62 includes the subject matter of any of Examples 59-61 further comprising a communication chip.

Example 63 includes the subject matter of any of Examples 59-62 further comprising a touch screen controller.

Example 64 includes the subject matter of any of Examples 59-63 further comprising dynamic random-access memory.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a first transistor device region including first body of semiconductor material with a first cross-sectional shape, and a first gate structure wrapped around the first body, wherein the first gate structure includes a gate electrode and a gate dielectric, the gate dielectric positioned between the first body and the gate electrode; and
   a second transistor device region including a second body of semiconductor material with a second cross-sectional shape, and a second gate structure wrapped around the second body, wherein the second gate structure includes a gate electrode and a gate dielectric, the gate dielectric positioned between the second body and the gate electrode;
   a first work function layer wrapped around the first body between the gate dielectric and the gate electrode of the first body and a second work function layer wrapped around the second body between the gate dielectric and the gate electrode of the second body;
   wherein the first and second transistor device regions are arranged in a vertically stacked configuration with the first body and the second body extending horizontally; and
   wherein the first cross-sectional shape is different from the second cross-sectional shape.

2. The integrated circuit of claim 1, wherein the first body is one a plurality of first bodies having a vertically elongated shape and the second body is one of a plurality of second bodies having a horizontally elongated shape.

3. The integrated circuit of claim 2, wherein the first cross-sectional shape has a ratio of height to width that is at least 1.5.

4. The integrated circuit of claim 1, wherein the first work function layer comprises a metal and the second work function layer comprises a metal.

5. The integrated circuit of claim 1, wherein the first body is one of a plurality of nanowires including a first nanowire and a second nanowire, and wherein the work function layer wrapped around the first nanowire merges with the work function layer wrapped around the second nanowire.

6. The integrated circuit of claim 1, wherein the first work function layer has a greater thickness along sides of the first body than along a top or a bottom of the first body.

7. The integrated circuit of claim 1, wherein the first body is one of a plurality of nanowires including a first nanowire and a second nanowire, the first gate structure defining a void vertically aligned between the first nanowire and the second nanowire.

8. The integrated circuit of claim 1, wherein the first body is one of a plurality of first nanowires vertically stacked with a first vertical spacing therebetween, and the second body is one of a plurality of second nanowires vertically stacked with a second vertical spacing therebetween, the second vertical spacing being different from the first vertical spacing.

9. The integrated circuit of claim 8, wherein the plurality of first nanowires includes a first nanowire and a second nanowire, and wherein the work function layer wrapped around the first nanowire merges with the work function layer wrapped around the second nanowire.

10. The integrated circuit of claim 1, wherein the first body and the second body comprise (i) a Group IV semiconductor material or (ii) a Group III-V semiconductor material.

11. The integrated circuit of claim 10, wherein the first body and the second body comprise (i) silicon or (ii) silicon and germanium.

12. The integrated circuit of claim 11, wherein the first body or the second body comprises $Si_{1-x}Ge_x$ with $x \leq 0.3$.

13. The integrated circuit of claim 10, wherein the first body and the second body comprise silicon with a (100) lattice structure in a horizontal plane.

14. A transistor structure comprising:
at least one first body of semiconductor material extending horizontally between and connecting a first source and a first drain;
at least one second body of semiconductor material extending horizontally between and connecting a second source and a second drain, the at least one second body arranged with the at least one first body in a spaced-apart vertical stack;
a first gate structure wrapped around the at least one first body, the first gate structure comprising a gate electrode and a gate dielectric wherein the gate dielectric is positioned between the gate electrode and each of the at least one first body; and
a second gate structure wrapped around the at least one second body, the second gate structure comprising a gate electrode and a gate dielectric wherein the gate dielectric is positioned between the gate electrode and each of the at least one second body;
wherein the at least one first body has a first cross-sectional shape and the at least one second body has a second cross-sectional shape, the first cross-sectional shape having a greater height than width and the second cross-sectional shape having a greater width than height.

15. The transistor structure of claim 14, wherein the first gate structure includes a work function layer wrapped around the at least one first body between the gate dielectric and the gate electrode, the work function layer having a greater thickness along a side of the at least one first body than along a top of the at least one first body.

16. The transistor structure of claim 15, wherein the at least one first body includes a first nanowire and a second nanowire, and wherein the work function layer wrapped around the first nanowire merges with the work function layer wrapped around the second nanowire.

17. The transistor structure of claim 14, wherein the at least one first body and the at least one second body are selected from a nanowire, a nanosheet, and a nanoribbon.

18. The transistor structure of claim 14, wherein the first cross-sectional shape has a ratio of height to width of at least 1.5.

19. The transistor structure of claim 14, wherein the at least one first body includes a first nanowire spaced vertically above a second nanowire, and wherein the first gate structure defines a void between the first nanowire and the second nanowire.

20. An integrated circuit comprising:
a first transistor device region including first body of semiconductor material with a first cross-sectional shape, and a first gate structure wrapped around the first body, wherein the first gate structure includes a gate electrode and a gate dielectric, the gate dielectric positioned between the first body and the gate electrode; and
a second transistor device region including a second body of semiconductor material with a second cross-sectional shape, and a second gate structure wrapped around the second body, wherein the second gate structure includes a gate electrode and a gate dielectric, the gate dielectric positioned between the second body and the gate electrode;
wherein the first and second transistor device regions are arranged in a vertically stacked configuration with the first body and the second body extending horizontally; and
wherein the first cross-sectional shape is different from the second cross-sectional shape, wherein the first body is one a plurality of first bodies having a vertically elongated shape and the second body is one of a plurality of second bodies having a horizontally elongated shape.

21. An integrated circuit comprising:
a first transistor device region including first body of semiconductor material with a first cross-sectional shape, and a first gate structure wrapped around the first body, wherein the first gate structure includes a gate electrode and a gate dielectric, the gate dielectric positioned between the first body and the gate electrode; and
a second transistor device region including a second body of semiconductor material with a second cross-sectional shape, and a second gate structure wrapped around the second body, wherein the second gate structure includes a gate electrode and a gate dielectric, the gate dielectric positioned between the second body and the gate electrode;
wherein the first and second transistor device regions are arranged in a vertically stacked configuration with the first body and the second body extending horizontally; and
wherein the first cross-sectional shape is different from the second cross-sectional shape, wherein the first body is one of a plurality of nanowires including a first nanowire and a second nanowire, the first gate structure defining a void vertically aligned between the first nanowire and the second nanowire.

22. An integrated circuit comprising:
a first transistor device region including first body of semiconductor material with a first cross-sectional shape, and a first gate structure wrapped around the first body, wherein the first gate structure includes a gate electrode and a gate dielectric, the gate dielectric positioned between the first body and the gate electrode; and
a second transistor device region including a second body of semiconductor material with a second cross-sectional shape, and a second gate structure wrapped around the second body, wherein the second gate structure includes a gate electrode and a gate dielectric, the gate dielectric positioned between the second body and the gate electrode;
wherein the first and second transistor device regions are arranged in a vertically stacked configuration with the first body and the second body extending horizontally; and
wherein the first cross-sectional shape is different from the second cross-sectional shape, wherein the first body is one of a plurality of first nanowires vertically stacked with a first vertical spacing therebetween, and the second body is one of a plurality of second nanowires vertically stacked with a second vertical spacing therebetween, the second vertical spacing being different from the first vertical spacing.

* * * * *